United States Patent
Gowdaru et al.

(10) Patent No.: US 9,835,388 B2
(45) Date of Patent: Dec. 5, 2017

(54) SYSTEMS FOR UNIFORM HEAT TRANSFER INCLUDING ADAPTIVE PORTIONS

(71) Applicant: Novellus Systems, Inc., Fremont, CA (US)

(72) Inventors: Keerthi Gowdaru, Bangalore (IN); Krishnan Shrinivasan, Bangalore (IN)

(73) Assignee: Novellus Systems, Inc., Fremont, CA (US)

( * ) Notice: Subject to any disclaimer, the term of this patent is extended or adjusted under 35 U.S.C. 154(b) by 821 days.

(21) Appl. No.: 13/730,605

(22) Filed: Dec. 28, 2012

(65) Prior Publication Data

US 2013/0175005 A1    Jul. 11, 2013

Related U.S. Application Data

(60) Provisional application No. 61/584,130, filed on Jan. 6, 2012.

(51) Int. Cl.
*F28F 7/00* (2006.01)
*F28F 3/00* (2006.01)
(Continued)

(52) U.S. Cl.
CPC .......... *F28F 3/00* (2013.01); *H01L 21/67109* (2013.01); *H01L 21/67288* (2013.01);
(Continued)

(58) Field of Classification Search
CPC .......... F28G 7/00; F28F 13/1016; F28F 27/00; F28F 3/00; H01L 21/027; H01L 21/02;
(Continued)

(56) References Cited

U.S. PATENT DOCUMENTS 3,020,131 A    2/1962   Knapic
3,612,825 A    10/1971  Chase et al.
(Continued)

FOREIGN PATENT DOCUMENTS

CN    101689486 A    3/2010
CN    102246287 A    11/2011
(Continued)

OTHER PUBLICATIONS

JP2009218536 machine translation.*
(Continued)

*Primary Examiner* — Davis Hwu
*Assistant Examiner* — Gordon Jones
(74) *Attorney, Agent, or Firm* — Weaver Austin Villeneuve & Sampson LLP

(57) ABSTRACT

Provided are adaptive heat transfer methods and systems for uniform heat transfer to and from various types of workpieces, such as workpieces employed during fabrication of semiconductor devices, displays, light emitting diodes, and photovoltaic panels. This adaptive approach allows for reducing heat transfer variations caused by deformations of workpieces. Deformation may vary in workpieces depending on types of workpieces, processing conditions, and other variables. Such deformations are hard to anticipate and may be random. Provided systems may change their configurations to account for the conformation of each new workpiece processed. Further, adjustments may be performed continuously of discretely during heat transfer. This flexibility can be employed to improve heat transfer uniformity, achieve uniform temperature profile, reduce deformation, and for various other purposes.

11 Claims, 17 Drawing Sheets

(51) Int. Cl.
*H01L 21/67* (2006.01)
*H01L 21/687* (2006.01)
*F28F 13/00* (2006.01)
*F28F 27/00* (2006.01)

(52) U.S. Cl.
CPC ........ *H01L 21/68735* (2013.01); *F28F 13/00* (2013.01); *F28F 27/00* (2013.01)

(58) Field of Classification Search
CPC ............. H01L 21/683; H01L 21/67109; H01L 21/67288; H01L 21/68735
See application file for complete search history.

(56) References Cited

U.S. PATENT DOCUMENTS

| | | | |
|---|---|---|---|
| 4,457,359 A | 7/1984 | Holden | |
| 4,535,835 A | 8/1985 | Holden | |
| 4,563,589 A | 1/1986 | Scheffer | |
| 4,615,755 A | 10/1986 | Tracy et al. | |
| 4,949,783 A | 8/1990 | Lakios et al. | |
| 5,113,929 A | 5/1992 | Nakagawa et al. | |
| 5,178,682 A | 1/1993 | Tsukamoto et al. | |
| 5,228,208 A | 7/1993 | White et al. | |
| 5,248,922 A * | 9/1993 | Meshkat | G05B 19/4142 |
| | | | 318/35 |
| 5,282,121 A | 1/1994 | Bornhorst et al. | |
| 5,447,431 A | 9/1995 | Muka | |
| 5,505,008 A | 4/1996 | Hugo et al. | |
| 5,558,717 A | 9/1996 | Zhao et al. | |
| 5,562,947 A | 10/1996 | White et al. | |
| 5,588,827 A | 12/1996 | Muka | |
| 5,656,093 A * | 8/1997 | Burkhart | H01L 21/6831 |
| | | | 118/500 |
| 5,811,762 A | 9/1998 | Tseng | |
| 5,838,121 A | 11/1998 | Fairbairn et al. | |
| 5,942,075 A | 8/1999 | Nagahata et al. | |
| 6,072,163 A | 6/2000 | Armstrong et al. | |
| 6,087,632 A | 7/2000 | Mizosaki et al. | |
| 6,113,704 A | 9/2000 | Satoh et al. | |
| 6,200,634 B1 | 3/2001 | Johnsgard et al. | |
| 6,214,184 B1 | 4/2001 | Chien et al. | |
| 6,222,161 B1 * | 4/2001 | Shirakawa | H01L 21/67109 |
| | | | 118/725 |
| 6,228,438 B1 | 5/2001 | Schmitt | |
| 6,263,587 B1 | 7/2001 | Raaijmakers et al. | |
| 6,307,184 B1 | 10/2001 | Womack et al. | |
| 6,320,736 B1 | 11/2001 | Shamouilian et al. | |
| 6,394,797 B1 | 5/2002 | Sugaya et al. | |
| 6,410,457 B1 | 6/2002 | M'Saad et al. | |
| 6,413,321 B1 | 7/2002 | Kim et al. | |
| 6,435,869 B2 | 8/2002 | Kitamura | |
| 6,444,039 B1 | 9/2002 | Nguyen | |
| 6,467,491 B1 | 10/2002 | Sugiura et al. | |
| 6,544,340 B2 | 4/2003 | Yudovsky | |
| 6,559,424 B2 | 5/2003 | O'Carroll et al. | |
| 6,561,796 B1 | 5/2003 | Barrera et al. | |
| 6,563,092 B1 | 5/2003 | Shrinivasan et al. | |
| 6,563,686 B2 | 5/2003 | Tsai et al. | |
| 6,639,189 B2 | 10/2003 | Ramanan et al. | |
| 6,750,092 B2 | 6/2004 | Won et al. | |
| 6,753,508 B2 | 6/2004 | Shirakawa | |
| 6,768,084 B2 | 7/2004 | Liu et al. | |
| 6,800,173 B2 | 10/2004 | Chiang et al. | |
| 6,803,237 B2 | 10/2004 | Manganini et al. | |
| 6,851,403 B2 | 2/2005 | Durr et al. | |
| 6,860,965 B1 | 3/2005 | Stevens | |
| 6,887,523 B2 | 5/2005 | Zhuang et al. | |
| 6,895,179 B2 | 5/2005 | Kanno | |
| 6,899,765 B2 | 5/2005 | Krivts et al. | |
| 6,933,004 B2 | 8/2005 | Chan et al. | |
| 7,024,105 B2 | 4/2006 | Fodor et al. | |
| 7,105,463 B2 | 9/2006 | Kurita et al. | |
| 7,138,606 B2 | 11/2006 | Kanno et al. | |
| 7,154,731 B1 | 12/2006 | Kueper | |
| 7,189,432 B2 | 3/2007 | Chiang et al. | |
| 7,194,199 B2 | 3/2007 | Yoo | |
| 7,247,819 B2 * | 7/2007 | Goto | H01L 21/67103 |
| | | | 219/444.1 |
| 7,253,125 B1 | 8/2007 | Bandyopadhyay et al. | |
| 7,265,061 B1 | 9/2007 | Cho et al. | |
| 7,311,782 B2 | 12/2007 | Strang et al. | |
| 7,318,869 B2 | 1/2008 | Chiang et al. | |
| 7,327,948 B1 | 2/2008 | Shrinivasan et al. | |
| 7,410,355 B2 | 8/2008 | Granneman et al. | |
| 7,576,303 B2 | 8/2009 | Natsuhara et al. | |
| 7,665,951 B2 | 2/2010 | Kurita et al. | |
| 7,845,891 B2 | 12/2010 | Lee et al. | |
| 7,941,039 B1 | 5/2011 | Shrinivasan et al. | |
| 7,960,297 B1 | 6/2011 | Rivkin et al. | |
| 7,981,763 B1 | 7/2011 | Van Schravendijk et al. | |
| 8,033,771 B1 | 10/2011 | Gage et al. | |
| 8,047,706 B2 | 11/2011 | Goodman et al. | |
| 8,052,419 B1 | 11/2011 | Nordin et al. | |
| 8,137,465 B1 | 3/2012 | Shrinivasan et al. | |
| 8,273,670 B1 | 9/2012 | Rivkin et al. | |
| 8,280,545 B2 | 10/2012 | Kondoh | |
| 8,288,288 B1 | 10/2012 | Gage et al. | |
| 8,371,567 B2 * | 2/2013 | Angelov | H01L 21/683 |
| | | | 156/345.52 |
| 8,454,294 B2 | 6/2013 | Gage et al. | |
| 8,637,411 B2 | 1/2014 | Swaminathan et al. | |
| 8,673,080 B2 | 3/2014 | Meinhold et al. | |
| 8,728,956 B2 | 5/2014 | LaVoie et al. | |
| 8,851,463 B2 | 10/2014 | Angelov et al. | |
| 8,920,162 B1 | 12/2014 | Nordin et al. | |
| 8,956,983 B2 | 2/2015 | Swaminathan et al. | |
| 8,971,009 B2 * | 3/2015 | Parkhe | F28F 3/00 |
| | | | 361/234 |
| 2002/0034886 A1 | 3/2002 | Kurita et al. | |
| 2002/0069820 A1 | 6/2002 | Yudovsky | |
| 2002/0117109 A1 | 8/2002 | Hazelton et al. | |
| 2002/0158060 A1 * | 10/2002 | Uchiyama | H05B 3/146 |
| | | | 219/436 |
| 2002/0162630 A1 | 11/2002 | Satoh et al. | |
| 2003/0013280 A1 | 1/2003 | Yamanaka | |
| 2003/0113187 A1 | 6/2003 | Lei et al. | |
| 2004/0018751 A1 | 1/2004 | Kusuda | |
| 2004/0023513 A1 | 2/2004 | Aoyama et al. | |
| 2004/0060917 A1 | 4/2004 | Liu et al. | |
| 2004/0183226 A1 | 9/2004 | Newell et al. | |
| 2004/0187790 A1 | 9/2004 | Bader et al. | |
| 2005/0006230 A1 | 1/2005 | Narushima et al. | |
| 2005/0045616 A1 | 3/2005 | Ishihara | |
| 2005/0166845 A1 | 8/2005 | Cox | |
| 2005/0173412 A1 | 8/2005 | Kondou et al. | |
| 2005/0226793 A1 | 10/2005 | Sakakura et al. | |
| 2005/0258164 A1 | 11/2005 | Hiramatsu et al. | |
| 2006/0018639 A1 | 1/2006 | Ramamurthy et al. | |
| 2006/0075960 A1 | 4/2006 | Borgini et al. | |
| 2006/0081186 A1 | 4/2006 | Shinriki et al. | |
| 2006/0196425 A1 | 9/2006 | Hwang et al. | |
| 2007/0029046 A1 | 2/2007 | Li et al. | |
| 2007/0107845 A1 | 5/2007 | Ishizawa et al. | |
| 2007/0205788 A1 | 9/2007 | Natsuhara et al. | |
| 2007/0243057 A1 | 10/2007 | Shimada et al. | |
| 2007/0280816 A1 | 12/2007 | Kurita et al. | |
| 2007/0283709 A1 | 12/2007 | Luse et al. | |
| 2008/0102644 A1 | 5/2008 | Goto et al. | |
| 2008/0134820 A1 | 6/2008 | Bjorck et al. | |
| 2008/0169282 A1 | 7/2008 | Sorabji et al. | |
| 2008/0217319 A1 | 9/2008 | Saule et al. | |
| 2008/0237214 A1 | 10/2008 | Scheer et al. | |
| 2009/0060480 A1 | 3/2009 | Herchen | |
| 2009/0142167 A1 | 6/2009 | Gage et al. | |
| 2009/0147819 A1 | 6/2009 | Goodman et al. | |
| 2009/0277472 A1 | 11/2009 | Rivkin et al. | |
| 2010/0163183 A1 | 7/2010 | Tanaka et al. | |
| 2010/0247804 A1 | 9/2010 | Roy | |
| 2010/0270004 A1 | 10/2010 | Landess et al. | |
| 2011/0017424 A1 | 1/2011 | Parkhe et al. | |
| 2011/0207245 A1 | 8/2011 | Koshimizu et al. | |
| 2011/0318142 A1 | 12/2011 | Gage et al. | |

(56) References Cited

U.S. PATENT DOCUMENTS

| | | | |
|---|---|---|---|
| 2012/0006489 A1* | 1/2012 | Okita | H01L 21/67757 156/345.43 |
| 2012/0009802 A1 | 1/2012 | LaVoie et al. | |
| 2012/0074126 A1 | 3/2012 | Bang et al. | |
| 2012/0222616 A1 | 9/2012 | Han et al. | |
| 2012/0264051 A1 | 10/2012 | Angelov et al. | |
| 2013/0122431 A1 | 5/2013 | Angelov et al. | |
| 2013/0145989 A1 | 6/2013 | Satitpunwaycha | |
| 2014/0170857 A1 | 6/2014 | Lang et al. | |
| 2014/0209562 A1 | 7/2014 | LaVoie et al. | |
| 2014/0216337 A1 | 8/2014 | Swaminathan et al. | |
| 2016/0056032 A1 | 2/2016 | Baldasseroni et al. | |

FOREIGN PATENT DOCUMENTS

| | | |
|---|---|---|
| EP | 0 746 009 | 12/1996 |
| JP | 61264649 | 11/1986 |
| JP | 62-229833 | 10/1987 |
| JP | 01-107519 | 4/1989 |
| JP | 06/037054 | 2/1994 |
| JP | 07-090582 | 4/1995 |
| JP | 07/147274 | 6/1995 |
| JP | 08-316215 | 11/1996 |
| JP | 09-092615 | 4/1997 |
| JP | 2000-286243 | 10/2000 |
| JP | 2002-246375 | 8/2002 |
| JP | 2002-373862 | 12/2002 |
| JP | 2003-324048 | 11/2003 |
| JP | 2005/116655 | 4/2005 |
| JP | 2006-210372 | 8/2006 |
| JP | 2007-158074 | 6/2007 |
| JP | 2007158074 A * | 6/2007 |
| JP | 2009-218536 | 9/2009 |
| JP | 2009218536 A * | 9/2009 |
| KR | 10-2002-0096524 | 12/2002 |
| KR | 2003/0096732 | 12/2003 |
| KR | 10-0836183 | 6/2008 |
| KR | 10-2008-0072275 | 8/2008 |
| TW | 200723352 | 6/2007 |
| TW | 200845283 | 11/2008 |
| WO | WO 98/54373 | 12/1998 |
| WO | 00/19492 | 4/2000 |
| WO | 02/11911 | 2/2002 |
| WO | WO 2007/067177 | 6/2007 |
| WO | WO 2007/145132 | 12/2007 |
| WO | WO 2009/001866 | 12/2008 |
| WO | WO 2010/068598 | 6/2010 |
| WO | WO 2010/101191 | 9/2010 |
| WO | WO 2012/141722 | 10/2012 |
| WO | WO 2013/103594 | 7/2013 |

OTHER PUBLICATIONS

JP2007158074 A machine translation.*

JP 2009-218536 A machine translation.*

U.S. Final Office Action, dated Jan. 30, 2014, issued in U.S. Appl. No. 13/276,202.

U.S. Notice of Allowance, dated Aug. 1, 2014, issued in U.S. Appl. No. 13/276,202.

U.S. Office Action, dated Oct. 6, 2015, issued in U.S. Appl. No. 13/621,060.

U.S. Office Action, dated May 22, 2014, issued in U.S. Appl. No. 12/435,890.

U.S. Final Office Action, dated Nov. 28, 2014, issued in U.S. Appl. No. 12/435,890.

U.S. Office Action, dated Jan. 3, 2014, issued in U.S. Appl. No. 13/736,410.

U.S. Notice of Allowance dated May 12, 2014 issued in U.S. Appl. No. 13/736,410.

U.S. Notice of Allowance dated Aug. 8, 2014 issued in U.S. Appl. No. 13/736,410.

Taiwan Office Action dated May 26, 2014 issued in TW098114857.

Taiwan Office Action and Search Report dated Jul. 11, 2014 issued in TW098142343.

Taiwan Office Action dated Nov. 21, 2014 issued in TW098142343.

Chinese First Office Action dated Sep. 16, 2014 issued in CN 20118006929.X.

Chinese Second Office Action [no translation] dated Feb. 28, 2015 issued in CN 20118006929.X.

TW Office Action dated Sep. 7, 2015 issued in TW 100117275.

PCT International Preliminary Report on Patentability, dated Jul. 17, 2014 issued in PCT/US2012/071976 .

U.S. Appl. No. 11/751,584, filed May 21, 2007, entitled "Cast pedestal with heating element on coaxial heat exchanger".

U.S. Appl. No. 13/370,579, filed Feb. 10, 2012, entitled "Single-chamber sequential curing of semiconductor wafers".

U.S. Appl. No. 11/546,189, filed Oct. 10, 2006, entitled "Concave Pedestal for Uniform Heating of Silicon Wafers".

U.S. Appl. No. 13/276,202, filed Oct. 18, 2011, "Closed Loop Temperature Heat Up and Control Utilizing Wafer-To-Heater Pedestal Gap Modulation".

U.S. Appl. No. 12/140,196, filed Jun. 16, 2008, entitled "Transferring Heat in Loadlocks".

U.S. Appl. No. 61/050,880, filed May 6, 2008, entitled "Photoresist Stripping Method and Apparatus".

U.S. Appl. No. 11/129,266, filed May 12, 2005, "Tailored profile pedestal for thermo-elastically stable cooling for heating of substrates".

U.S. Appl. No. 13/086,010, filed Apr. 13, 2011, entitled "High Temperature Pedestal Overlay for Stable & Uniform Heat Transfer".

U.S. Appl. No. 13/736,410, filed Jan. 8, 2013, entitled "High Temperature Pedestal Overlay for Stable & Uniform Heat Transfer".

U.S. Office Action, dated Jul. 18, 2006, issued in U.S. Appl. No. 11/184,101.

Notice of Allowance and Fee Due, dated Jan. 25, 2007, issued in U.S. Appl. No. 11/184,101.

U.S. Office Action, dated Jun. 8, 2010, issued in U.S. Appl. No. 11/851,310.

U.S. Notice of Allowance, dated Jan. 5, 2011, issued in U.S. Appl. No. 11/851,310.

U.S. Office Action, dated Jun. 16, 2008, issued in U.S. Appl. No. 11/546,189.

U.S. Final Office Action, dated Oct. 16, 2008, issued in U.S. Appl. No. 11/546,189.

U.S. Office Action, dated Apr. 26, 2010, issued in U.S. Appl. No. 11/608,185.

U.S. Office Action, dated Nov. 26, 2010, issued in U.S. Appl. No. 11/608,185.

U.S. Notice of Allowance, dated Mar. 22, 2011, issued in U.S. Appl. No. 11/608,185.

U.S. Office Action, dated Apr. 9, 2010, issued in U.S. Appl. No. 11/937,364.

U.S. Final Office Action, dated Dec. 27, 2010, issued in U.S. Appl. No. 11/937,364.

U.S. Notice of Allowance, dated Sep. 19, 2011, issued in U.S. Appl. No. 11/937,364.

U.S. Office Action, dated Oct. 24, 2012, issued in U.S. Appl. No. 13/276,202.

U.S. Office Action, dated Jan. 4, 2012, issued in U.S. Appl. No. 12/140,196.

U.S. Notice of Allowance, dated Jun. 15, 2012, issued in U.S. Appl. No. 12/140,196.

U.S. Office Action, dated Dec. 28, 2011, issued in U.S. Appl. No. 12/435,890.

U.S. Final Office Action, dated Apr. 12, 2012, issued in U.S. Appl. No. 12/435,890.

U.S. Office Action, dated Aug. 22, 2012, issued in U.S. Appl. No. 12/435,890.

U.S. Office Action, dated Dec. 27, 2010, issued in U.S. Appl. No. 12/333,239.

U.S. Final Office Action, dated Mar. 9, 2011, issued in U.S. Appl. No. 12/333,239.

U.S. Notice of Allowance, dated Jun. 27, 2011, issued in U.S. Appl. No. 12/333,239.

(56) References Cited

OTHER PUBLICATIONS

U.S. Office Action, dated Oct. 22, 2012, issued in U.S. Appl. No. 13/227,160.
U.S. Office Action, dated Feb. 20, 2009, issued in U.S. Appl. No. 11/129,266.
U.S. Office Action, dated Oct. 28, 2009, issued in U.S. Appl. No. 11/129,266.
U.S. Office Action, dated Feb. 6, 2012, issued in U.S. Appl. No. 12/749,170.
U.S. Final Office Action, dated Jun. 20, 2012, issued in U.S. Appl. No. 12/749,170.
U.S. Notice of Allowance, dated Oct. 10, 2012, issued in U.S. Appl. No. 13/086,010.
PCT International Search Report and Written Opinion, dated Apr. 6, 2012, issued in WO Patent Application No. PCT/US2011/034819.
PCT International Search Report and Written Opinion, dated Aug. 2, 2010, issued in WO Patent Application No. PCT/US2009/067040.
U.S. Appl. No. 13/621,060, filed Sep. 15, 2012, entitled "Transferring Heat in Loadlocks".
U.S. Final Office Action, dated Jun. 6, 2013, issued in U.S. Appl. No. 13/276,202.
U.S. Office Action, dated Feb. 28, 2013, issued in U.S. Appl. No. 12/435,890.
U.S. Notice of Allowance, dated Feb. 27, 2013, issued in U.S. Appl. No. 13/227,160.
PCT International Report on Patentability and Written Opinion, dated Jun. 3, 2011, issued in PCT/US2009/067040.
Chinese First Office Action dated Jan. 23, 2013 issued in CN 200980149339.5.
Chinese Second Office Action dated Sep. 11, 2013 issued in CN 200980149339.5.
PCT International Preliminary Report on Patentability and Written Opinion, dated Oct. 24, 2013, issued in PCT/US2011/034819.
JP Notice of Reasons for Rejection dated Apr. 9, 2013 issued in JP 2013510129.
PCT International Search Report and Written Opinion, dated Apr. 12, 2013 issued in PCT/US2012/071976.
Korean Office Action [no translation] dated Feb. 1, 2016 issued in KR 10-2011-7015366.
Chinese Office Action [no translation] dated Jan. 15, 2016 issued in CN 201280066240.0.
U.S. Appl. No. 15/232,708, filed Aug. 9, 2016, entitled "Suppressing Interfacial Reactions by Varying the Wafer Temperature Throughout Deposition".
Korean Office Action dated Feb. 1, 2016 issued in Application No. KR 10-2011-7015366.
Chinese First Office Action dated Jan. 15, 2016 issued in Application No. CN 201280066240.0.
Taiwan Notice of Allowance and Search Report dated Mar. 29, 2016 issued in Application No. TW 105102104.
Chinese Second Office Action dated Aug. 31, 2016 issued in Application No. CN 201280066240.0.
Taiwan Examination and Search Report dated Aug. 9, 2016 issued in Application No. TW 102100308.
Chinese Third Office Action dated Mar. 13, 2017 issued in Application No. CN 201280066240.0.
U.S. Final Office Action, dated Apr. 22, 2016, issued in U.S. Appl. No. 13/621,060.
U.S. Office Action, dated Jun. 30, 2017, issued in U.S. Appl. No. 14/466,925.
Chinese First Office Action dated Jul. 13, 2017 issued in Application No. CN201510519683.6.

\* cited by examiner

SYSTEMS FOR UNIFORM HEAT TRANSFER INCLUDING ADAPTIVE PORTIONS

CROSS-REFERENCE TO RELATED APPLICATIONS

This application claims priority under 35 U.S.C. §119(e) to U.S. Provisional Application Ser. No. 61/584,130 filed on Jan. 6, 2012, which is hereby incorporated by reference in its entirety and for all purposes.

BACKGROUND

Semiconductor and other thin film technologies often employ heated or cooled pedestals to control the temperature of workpieces prior to, during, or after processing of the workpieces. For example, a heated pedestal may be used in a processing chamber to heat and maintain a predetermined temperature of a workpiece during deposition of a layer onto the workpiece, removing materials from the workpiece surfaces, or performing other processing operations. Heated or cooled pedestals may also be provided in load locks for heating or cooling workpieces as they are being transferred in or out of the processing environment. Such pedestals may be made of aluminum or ceramic materials and formed into a single monolithic piece. A workpiece is supported above a surface of this pedestal to achieve heat transfer (i.e., heating or cooling depending on relative temperatures of the workpiece and pedestal). A gap between the pedestal surface and workpiece provides some control to this heat transfer such that a higher heat transfer rate corresponds to a smaller gap, while a lower heat transfer rate corresponds to a larger gap (i.e., the inverse proportional relationship).

Often, workpieces, particularly large but thin wafers (e.g., 450 millimeter wafers) are deformed when introduced into a processing system and need to be heated or cooled uniformly. Some common examples of such deformations include bowing, when a workpiece has a concave shape with its center portion extending downward with respect to the plane defined by its edges; and doming, when a workpiece has a convex shape with its center portion extending upward with respect to the plane defined by its edges. Deformations may also have various non-symmetrical shapes. Deformation may occur due to coefficient of thermal expansion differences among various materials forming workpieces, compressive or tensile films deposited on their surfaces, and other factors. Often workpieces in the same batch have different kinds and levels of deformation. These deformations are hard to anticipate and often random in nature. Furthermore, some deformation may occur during heat transfer, while the workpiece is already in the system. These "in process" deformations may be due to changes in workpiece temperature, deposition of additional materials, and other reasons. As such, it is difficult, and generally may not be possible to have preset heat transfer surfaces that always conform to deformed workpieces. Generally, pedestals with planar surfaces have been used because of this relatively unpredictable nature of deformations. While pedestals with predetermined curved surfaces have been proposed, their application is limited to only very specific types of deformation.

When a deformed workpiece is positioned over a planar surface of the pedestal, the gap between that surface and the workpiece will vary throughout the surface. This variation may cause non-uniform heat transfer throughout the surface, which may result in a non-uniform temperature profile of the workpiece. The temperature variation may interfere with processing and result, for example, in uneven deposition or material removal rates throughout the surface. Further, this temperature variation may cause further deformation and, in certain cases, permanent damage of the workpiece. For example, excessive deformation may cause slip dislocations in silicon structures, when portions of silicon lattice are displaced with respect to each other. This defect may degrade the electrical performance of the device. In some cases, workpieces may even break inside the apparatus, which causes prolonged shutdowns and expensive cleanups.

SUMMARY

Provided are adaptive heat transfer methods and systems for uniform heat transfer to and from various types of workpieces, such as workpieces employed during fabrication of semiconductor devices, displays, light emitting diodes, and photovoltaic panels. This adaptive approach allows for reducing heat transfer variations caused by deformations of workpieces.

Deformation may vary in workpieces depending on types of workpieces, processing conditions, and other variables. Such deformations are hard to anticipate and may be random.

Provided systems may change their configurations to account for the deformation of each new workpiece processed. Further, adjustments may be performed continuously or discretely during heat transfer. This flexibility can be employed to improve heat transfer uniformity, to achieve uniform temperature profile, to reduce deformation, and for various other purposes. In disclosed embodiments, systems may include sensors for measuring temperature profiles of workpieces and/or gap variations between workpieces and heat transferring surfaces of the system. Positions and/or shapes of these surfaces can then be adjusted based on the responses of these sensors.

In certain embodiments, a heat transfer system for providing substantially uniform heat transfer to or from a workpiece exhibiting deformation is provided. The heat transfer system may include first and second heat transfer portions. The first heat transfer portion may have a first workpiece facing surface and a first set of minimum contact area supports extending from the first workpiece facing surface for supporting the workpiece that exhibits deformation. The first workpiece is supported at a predetermined distance above the first workpiece facing surface. The second heat transfer portion has a second workpiece facing surface. The second workpiece facing surface is movable with respect to the first workpiece facing surface to provide uniform heat transfer. Uniform heat transfer is provided between the workpiece exhibiting deformation and first workpiece facing surface as well as between the workpiece exhibiting deformation and the second workpiece facing surface. Uniform heat transfer helps to maintain a substantially uniform temperature profile throughout an entire area of the workpiece exhibiting deformation.

In certain embodiments, the second workpiece facing surface is movable with respect to the first workpiece facing surface to conform to a non-planar shape of the workpiece exhibiting deformation. The second workpiece facing surface may be movable with respect to the first workpiece facing surface, during heating or cooling, until an average gap between the second workpiece facing surface and the workpiece exhibiting deformation is substantially the same as an average gap between the first workpiece facing surface and the workpiece exhibiting deformation.

In certain embodiments, the heat transfer system also includes a system controller for controlling movement of the second workpiece facing surface with respect to the first workpiece facing surface while heating or cooling the workpiece exhibiting deformation. The heat transfer system may also include one or more sensors provided in the second workpiece facing surface and/or the first workpiece facing surface to provide input to the control system. These sensors may be configured to sense one or more parameters, such as a temperature profile of the workpiece exhibiting deformation, a gap between the second workpiece facing surface and the workpiece exhibiting deformation, and a gap between the first workpiece facing surface and the workpiece exhibiting deformation. The heat transfer system may also include a lifting mechanism controlled by the system controller to move the second workpiece facing surface with respect to the first workpiece facing surface.

In certain embodiments, the first workpiece facing surface has a circular (e.g., ring) shape having a first radius. In these embodiments, the sensors may include a first sensor positioned in a center of the first workpiece facing surface and at one end of the first radius, a second sensor positioned at another end of the first radius, and a third sensor positioned along the first radius in between the first sensor and the second sensor. The circular shape of the first workpiece facing surface may also have a second radius positioned at an angle with respect to the first radius. Another third sensor may be positioned along this second radius. In certain embodiments, the second radius is substantially perpendicular to the first radius.

The second workpiece facing surface may be positioned above and facing the first workpiece facing surface. In these embodiments, the workpiece exhibiting deformation is positioned in between the first and second workpiece facing surfaces. The first heat transfer portion may be a part of a first pedestal, while the second heat transfer portion may be a part of a second pedestal. The first and second pedestals are provided in a processing chamber or in a load lock. In other embodiments, the first heat transfer portion may be a part of the first pedestal, while the second heat transfer portion may be a part of the shower head. The shower head may have multiple openings for supplying a precursor during processing of the workpiece exhibiting deformation.

In certain embodiments, the first and second heat transfer portions form the same pedestal. In these embodiments, the second heat transfer portion may also include a set of minimum contact area supports extending from the second workpiece facing surface for supporting the workpiece at a predetermined distance above the second workpiece facing surface. The surface area of the first workpiece facing surface may be substantially the same as the surface area of the second workpiece facing surface. In specific embodiments, the first workpiece facing surface has a circular shape having a first diameter. The second workpiece has a disk shape having an inner diameter substantially the same as the first diameter of the circular shape of the first workpiece facing surface. The heat transfer system may also include a third heat transfer portion having a third workpiece facing surface. The third workpiece facing surface may have a disk shape with an inner diameter substantially the same as an outer diameter of the second workpiece facing surface. The third workpiece facing surface is movable with respect to the first workpiece facing surface independently from the second workpiece facing surface to provide uniform heat transfer. In these embodiments, two or more heat transfer portions are arranged as nested cylinders.

In other embodiments, the first and second workpiece facing surfaces have circle sector shapes. These surfaces may form a circle together with one or more additional workpiece facing surfaces of one or more additional heat transfer portions. The one or more additional workpiece facing surfaces may be movable with respect to the first workpiece facing surface to provide uniform heat transfer. In the same or other embodiments, the first workpiece facing surface, second workpiece facing surface, and one or more additional workpiece facing surfaces are pivotable with respect to a center of the circle.

Provided also is a heat transfer pedestal for providing uniform heat transfer to a workpiece exhibiting deformation. The heat transfer pedestal may include a base support and a bendable heat transfer plate including a continuous workpiece facing surface. The continuous workpiece facing surface is configured to change its shape in order to conform to a shape of the workpiece exhibiting deformation to provide uniform heat transfer between the workpiece exhibiting deformation and the continuous workpiece facing surface upon exerting a force on the bendable heat transfer plate. The force may be exerted by changing a pressure in a space between the base support and the bendable heat transfer plate by supplying or removing a gas or a liquid from the space between the base support and bendable heat transfer plate. In the same or other embodiments, the force may be exerted by one or more mechanical structures attached to the bendable heat transfer plate and configured to move with respect to the base support.

Provided also is a method for providing uniform heat transfer to or from a workpiece exhibiting deformation. The method may involve positioning the workpiece exhibiting deformation having a non-planar shape onto a first set of minimum contact area supports that extend from a first workpiece facing surface of a first heat transfer portion. The first workpiece facing surface may be movable with respect to a second workpiece facing surface. The temperature of the workpiece exhibiting deformation may be different from the temperature of the first workpiece facing surface and the temperature of the second workpiece facing surface. The method may proceed with determining one or more parameters, such as a temperature profile of the workpiece exhibiting deformation, a gap between the second workpiece facing surface and the workpiece exhibiting deformation, and a gap between the first workpiece facing surface and the workpiece exhibiting deformation. The method may continue with adjusting a position of the first workpiece facing surface with respect to the second workpiece facing surface based on the one or more determined parameters. The workpiece exhibiting deformation may be then removed when the workpiece reaches a predetermined temperature.

In certain embodiments, the method may involve repeating determining and adjusting operations described above one or more times prior to removing the workpiece. Examples of workpieces include a semiconductor substrate, a photovoltaic substrate, and a display substrate. In certain embodiments, the temperature profile of the workpiece exhibiting deformation deviates by less than about 5° C. prior to removing the workpiece. The workpiece may exhibit less deformation at the time of removing than at the time of positioning.

In certain embodiments, a method also involves applying photoresist to the workpiece, exposing the photoresist to light, patterning the resist and transferring the pattern to the workpiece, and selectively removing the photoresist from the workpiece. In these embodiments, a semiconductor processing system may include a stepper.

These and other embodiments are described further below with reference to the figures.

DETAILED DESCRIPTION

In the following description, numerous specific details are set forth in order to provide a thorough understanding of the presented concepts. The presented concepts may be practiced without some or all of these specific details. In other instances, well-known process operations have not been described in detail so as to not unnecessarily obscure the described concepts. While some concepts will be described in conjunction with the specific embodiments, it will be understood that these embodiments are not intended to be limiting.

Introduction

Figure 1A:
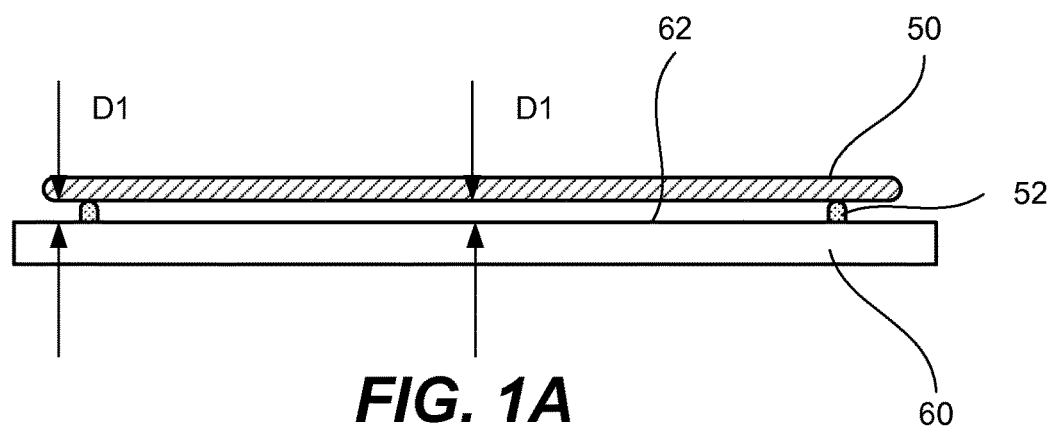
FIG. 1A is a drawing depicting a cross-sectional view of a flat workpiece supported above a workpiece facing surface of a pedestal using minimum contact area (MCA) supports, according to embodiments.
Figure 1B:
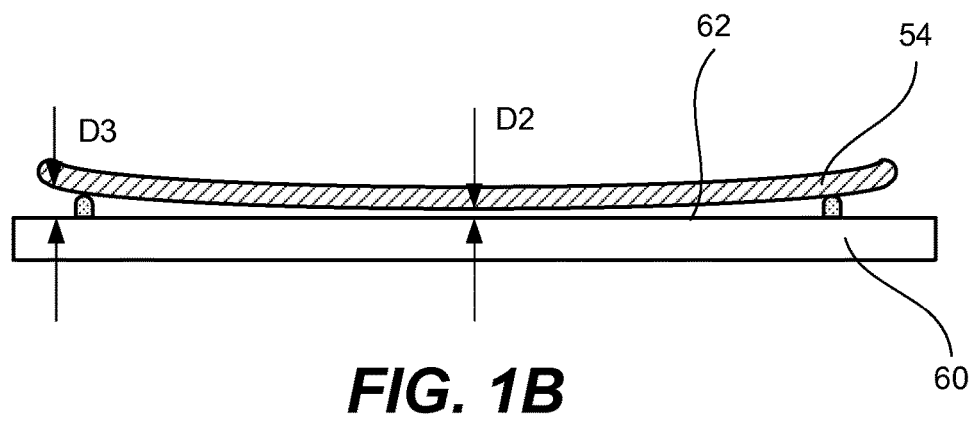
FIG. 1B is a drawing depicting a cross-sectional view of a deformed workpiece supported above the same workpiece facing surface of the pedestal of FIG. 1A.

A deformed workpiece is compared to a flat workpiece in FIGS. 1A and 1B. Specifically, these figures illustrate gap variations between the center and edge portions of these workpieces positioned over the planar pedestal surfaces. FIG. 1A illustrates a flat workpiece 50 supported above a workpiece facing surface 62 of a pedestal 60 using, for example, minimum contact area (MCA) supports 52. Since both workpiece 50 and workpiece facing surface 62 are flat, the gap between is constant throughout the entire workpiece.

Specifically, the gap in the center portion of workpiece 50 (identified as D1) is substantially the same as the gap near the edge portion of workpiece 50 (also identified as D1). This constant gap is generally determined by the height of MCA supports 52.

FIG. 1B illustrates a deformed workpiece 54 supported above the same workpiece facing surface 62 of pedestal 60 of FIG. 1A. Workpiece 54 is bowed. As a result, the gap between its center portion and workpiece facing surface 62 (identified as D2) is less than the gap between its edge portions and workpiece facing surface 62 (identified as D3), i.e., D3>D2. In this example, a heat flux between workpiece 54 and workpiece facing surface 62 may be greater in the center portion than near the edges because of these gap differences. During heating of workpiece 54, its center portion is likely to have a higher temperature than its edges. In a similar manner, during cooling of workpiece 54, its center portion is likely to have a lower temperature than its edges. This uneven temperature distribution is further reflected below in thermal modeling results.

Adaptive heat transfer systems and methods provide uniform heating and/or cooling of deformed workpieces. A system may adjust its one or more heat transfer surfaces to provide uniform heat transfer. For example, a system may move one of its multiple workpiece facing surfaces with respect to others or to change the shape of a continuous workpiece surface facing of a bendable heat transfer plate. In certain embodiments, these adjustments result in a more conformal workpiece facing surface than the initial surface and, as a result, more uniform heat transfer.

In certain embodiments, a pedestal may include multiple concentric cylinders independently movable with respect to each other in the direction substantially perpendicular to the workpiece. In other embodiments, a pedestal may include multiple sectors that are independently pivotable with respect to, for example, the center of the pedestal. In yet other embodiments, a workpiece is positioned between two workpiece facing surfaces, which may be substantially planar and parallel to each other. Even though neither one of these two workpiece facing surfaces may be conformal to the workpiece, the combined heat transfer may be still uniform. A portion of the workpiece, which is closer to one these surfaces, will be further away from another surface and vice versa. As such, even though each surface may provide non-uniform heat transfer, a combination of their individually non-uniform heat fluxes may be uniform.

Adjustment of various hardware components may be controlled based on one or more process parameters, such as a temperature profile of the workpiece and/or a gap profile between the workpiece and one or more workpiece facing surfaces. A system controller may be used to receive input from the sensors and control one or more mechanisms used for repositioning and/or adjusting shapes of one or more workpiece facing surfaces.

Uniform heat transfer features of various pedestals described below may be used for both cooling and heating workpieces. In order to keep this document focused and concise, references are generally made to heating a workpiece. However, one having ordinary skill in the art would understand how to apply these methods and systems for cooling workpieces as well.

Figure 1C:
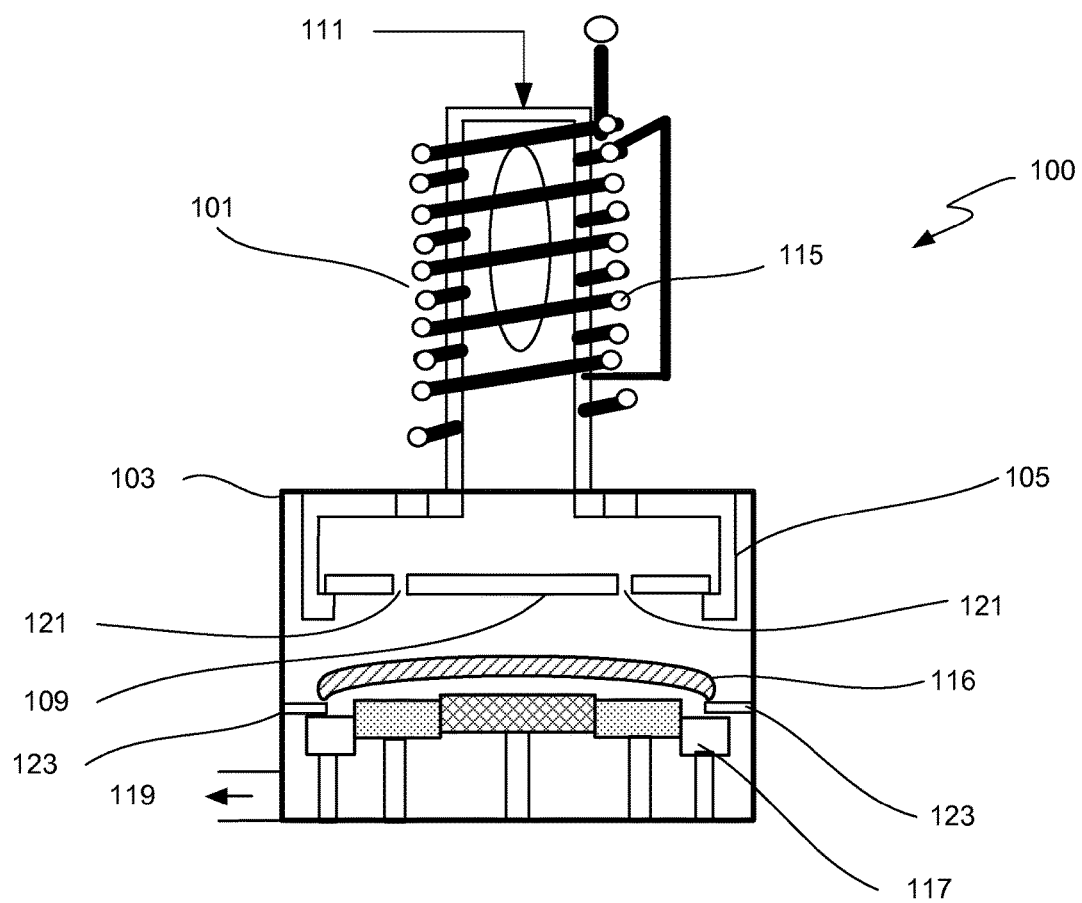
FIG. 1C is a schematic drawing depicting a cross-sectional view of an apparatus for processing semiconductor workpiece, in accordance with embodiments.

To better understand various features of adaptive heat transfer systems and methods, a brief description of one example of a processing apparatus is provided herein. FIG. 1C is a schematic representation of apparatus 100 for processing semiconductor workpieces, in accordance with certain embodiments. Apparatus 100 generally represents various types of equipment configured, for example, to remove photoresist materials and/or other residue materials from semiconductor workpieces, as well conduct other semiconductor processing operations. Some specific examples include the GAMMA 2100, 2130 I2CP (Interlaced Inductively Coupled Plasma), G400, GxT, and the SIERRA, all of which are available from Novellus Systems in San Jose, Calif. Other systems include the FUSION line, which is available from Axcelis Technologies in Rockville, Md.; TERA21, which is available from PSK Tech in Korea; and ASPEN, which is available from Mattson Technology in Fremont, Calif. Some processing chambers containing adaptive heat transfer systems may be associated with cluster tools. For example, a strip chamber may be added to the CENTURA cluster tool, which is available from Applied Materials in Santa Clara, Calif. Other examples include ALTUS and VECTOR, available from Novellus Systems in San Jose, Calif.

Apparatus 100 includes plasma source 101 for generating and providing energized or activated reactant species into chamber 103. Chamber 103 may be separated from plasma source 101 by showerhead assembly 105. A showerhead 109 forms the bottom of showerhead assembly 105. Plasma source 101 is connected to process gas inlet 111, which supplies one or more process gasses through showerhead assembly 105 into processing chamber 103. A low-pressure environment is attained in processing chamber 103 via vacuum pump and conduit 119.

Processing chamber 103 includes pedestal 117. Pedestal 117 is used to support a semiconductor workpiece 116 and to heat and/or cool semiconductor workpiece 116. As such, pedestal 117 may be fitted with a heating and/or cooling element. In some embodiments, pedestal 117 is also configured for applying an electrical potential bias to semiconductor workpiece 116. Pedestal 117 is shown to include multiple heat transfer portions, which are independently movable with respect to each other in the vertical direction. Other examples are adaptive heat transfer pedestals are described below.

During processing, one or more process gases are introduced via gas inlet 111 through plasma source 101. The gases may contain one or more chemically active species. Plasma source 101 may be used to ionize the gases in order to generate activated species and to form plasma. In the illustrated example, plasma source 101 is equipped with Radio Frequency (RF) induction coils 115. Showerhead 109 then directs these activated reactant species into processing chamber 103 through showerhead holes 121. Any number and arrangement of showerhead holes 121 may be used to try to maximize uniformity of distribution of the activated reactant species towards the surface of semiconductor workpiece 116.

Pedestal 117 may be temperature controlled and used for heating semiconductor workpiece 116. There may be some gap between pedestal 117 and semiconductor workpiece 116 during processing. The gap may be provided by MCA supports, which are further described below with reference to FIG. 1A. In certain embodiments, some contact may be allowed between the workpiece-facing surface of pedestal 117 and workpiece 116. The gap may be increased by lowering the pedestal 117 or decreased by raising the pedestal 117. When the pedestal 117 is lowered, semiconductor workpiece 116 is supported by pegs 123, which may be attached to the process chamber 103. In other embodiments, fingers of an internal robot may support the semiconductor workpiece while the pedestal 117 is in the lowered position.

Some heat flux may be provided by thermal conduction. Some additional heat flux may be provided by radiation. The relative contributions of these two heat transfer methods depend on the size of the gap between pedestal 117 and workpiece 116, emissivity of the workpiece-facing surface of pedestal 117, pressure inside processing chamber 103, and other factors. In certain embodiments, thermal conduction is the largest contributor to the overall heat flux.

The apparatus/process described hereinabove may be used in conjunction with lithographic patterning tools or processes, for example, for the fabrication or manufacture of semiconductor devices, displays, light emitting diodes (LEDs), photovoltaic panels, and the like. Typically, though not necessarily, such tools/processes may be used/conducted together in a common fabrication facility. Lithographic patterning of a film typically comprises some or all of the following steps, each step enabled with a number of possible tools: (1) application of photoresist on a workpiece (i.e., using a spin-on or spray-on tool); (2) curing of photoresist using a hot plate or furnace or ultraviolet (UV) curing tool; (3) exposing the photoresist to visible, UV, or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Independently Controllable Multiple Workpiece Facing Surfaces

In certain embodiments, an adaptive heat transfer system includes multiple heat transfer portions with each portion having a separate workpiece facing surface. Positions of these workpiece facing surfaces are adjustable with respect to each other. The position of one workpiece facing surface may be fixed with respect to a workpiece by, for example, providing a set of MCA supports extending from this surface. This surface may be used as a reference surface for adjusting positions of other surfaces.

Positions of workpiece facing surfaces are adjusted to provide uniform heat transfer between a workpiece and a combination of all surfaces. For example, workpieces may have different deformations and may need different relative positions of the workpiece facing surfaces to conform to these different deformations and to provide substantially uniform heat transfer regardless of the deformation. Uniform heat transfer may ensure a substantially uniform temperature profile throughout the entire area of the workpiece. For example, temperature deviations throughout the entire area of the workpiece may be less than about 10° C. or, more specifically, less than about 5° C. These temperature deviations may define substantially uniform heat transfer.

Multiple workpiece facing surfaces may be positioned on the same side of a workpiece and form a combined adjustable workpiece facing surface. Multiple workpiece facing surfaces may be adjusted in a direction substantially perpendicular to the plane defined by a planar workpiece (i.e., the workpiece without any deformations). This type of adjustment may be referred to as a vertical adjustment. In these embodiments, multiple workpiece facing surfaces may remain parallel to each during vertical adjustment. In other embodiments, surfaces may be positioned at an angle with respect to each other, and these preset angles may be maintained during vertical adjustment of the workpiece facing surfaces. Alternatively, multiple workpiece facing surfaces may pivot with respect to each other and/or with respect to the center of the combined surface (e.g., a center of the pedestal). These pivotable surfaces may or may not have independent vertical adjustment in addition to pivoting.

In certain embodiments, two workpiece facing surfaces are provided on different sides of a workpiece. The uniform heat transfer is ensured by a combined heat transfer between the workpiece and two surfaces. Both surfaces may be planar and be substantially parallel to each other. In certain embodiments, both surfaces may have some curvature. Furthermore, each one of the two surfaces may include multiple surfaces independently adjustable with respect to each other as further explained above. The gap between two surfaces provided on the opposite sides of the workpiece depends on the thickness of the workpiece, deformation of the workpiece, temperature of each surface, a predetermined gap between the workpiece and one of these surfaces (e.g., provided by MCA supports) and other factors. The combined heat transfer from the two surfaces ensures an even temperature profile.

Each of these embodiments will now be explained in more details with reference to corresponding figures.

Vertically Adjustable Workpiece Facing Surfaces

Figure 2A:
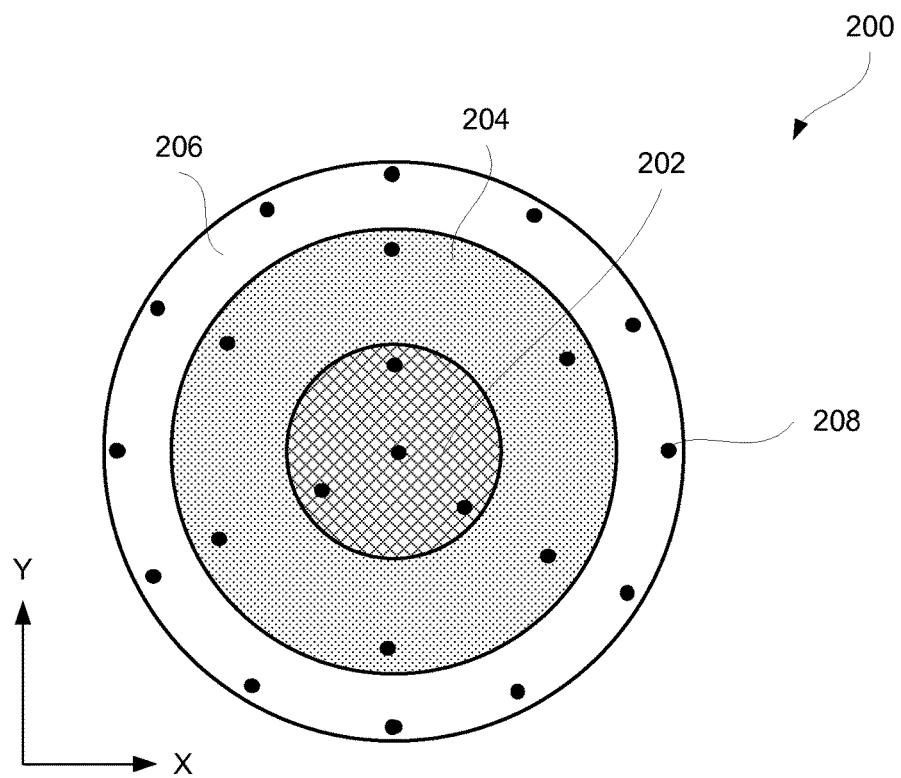
FIG. 2A is a schematic drawing depicting a top view of an adaptive heat transfer pedestal having three concentric cylindrical portions that are independently movable with respect to each other in the vertical direction, in accordance with embodiments.
Figure 2B:
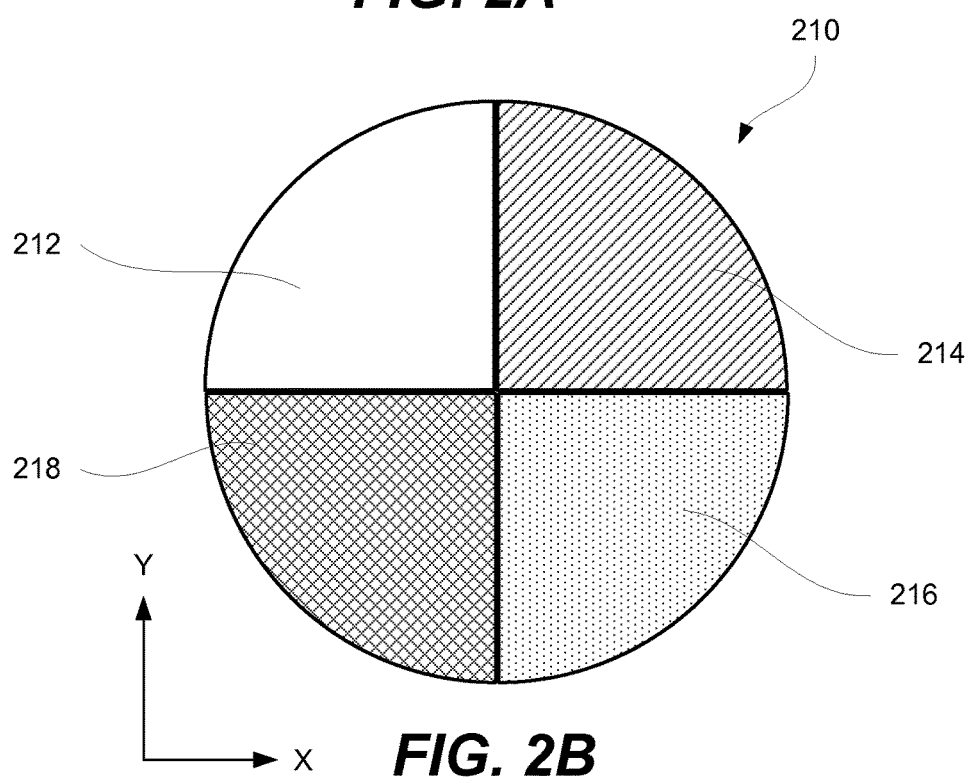
FIG. 2B is a schematic drawing depicting a top view of an adaptive heat transfer pedestal having four sector-shaped portions, in accordance with embodiments.

FIG. 2A is a top schematic view of heat transfer pedestal 200 having three concentric cylindrical portions 202, 204, and 206 that are independently movable with respect to each other in the vertical direction, in accordance with certain embodiments. The vertical direction is defined as a direction substantially perpendicular to the X-Y plane shown in this figure. Further, the vertical direction is substantially perpendicular to a planar workpiece when one is positioned onto pedestal 200. Sometimes pedestal 200 or similar pedestals are referred to as segmented pedestals. However, workpiece facing surfaces of portions of these segmented pedestals may correspond to any shapes/portions of the circle and are not limited to circle segments. For example, FIG. 2A shows portion 202 having a circular shape, while portions 204 and 206 have a disk shape. FIG. 2B shows portions 212, 214, 216, and 218 having sector shapes. Sometimes, portions of such segmented pedestals are referred to as segments. However, unless specifically noted, segments may have workpiece facing surfaces of any shape.

A segmented pedestal may have any number of portions, such as two, three, four, or more portions. More portions allow for forming a combined workpiece facing profile that is more conformal to deformations, such as bowing and doming, of workpieces as further explained below with reference to FIGS. 3A, 3B and 3C. However, each movable segment may use a separate lifting mechanism, which may complicate the overall system.

FIG. 2A also illustrates MCA supports 208 provided on workpiece facing surfaces of concentric cylindrical portions 202, 204, and 206. MCA supports 208 may extend by the same distance from their respective surfaces and be used to prevent a workpiece from touching these surfaces. In these embodiments, the uniformity of heat transfer may be associated with the number of MCA supports that come into contact with the workpiece. That is, the higher the number of MCA supports, the more uniformity. Also, a uniform distribution of MCA supports on the surface may provide higher heat transfer uniformity. In certain embodiments, the distribution of MCA supports is such that a distance between any pair of adjacent MCA supports is substantially the same.

FIG. 2B is a top schematic view of heat transfer pedestal 210 having four sector-shaped portions 212-218, in accordance with certain embodiments. A sector is defined as a part of a circle enclosed by two radii of that circle and their intercepted arc. A sector is sometimes referred to as a pie-shaped part of a circle. These four sectors form a full circle that defines the boundary of pedestal 210. As with the previous embodiments, a segmented pedestal may have any number of such sectors, generally three or more. The four sector-shaped portions 212-218 are independently movable with respect to each other in the vertical direction. This heat transfer pedestal may be used for workpieces that deform asymmetrically.

Figure 2C:
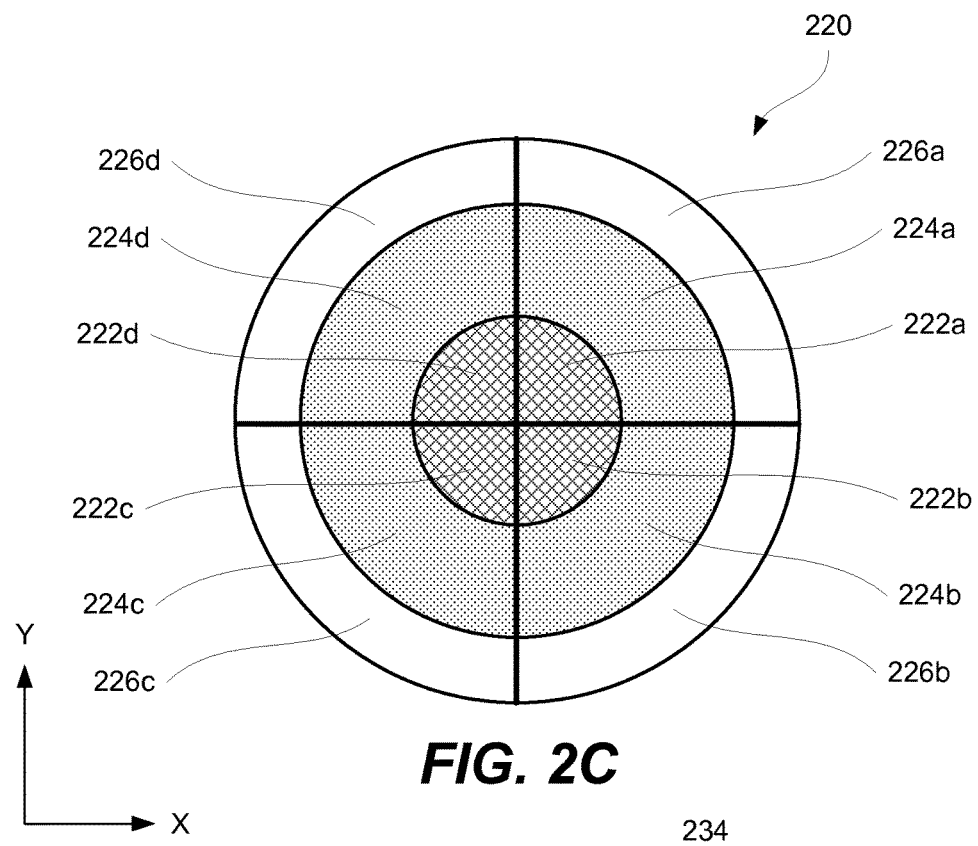
FIG. 2C is a schematic drawing depicting a top view of an adaptive heat transfer pedestal having twelve portions, in accordance with embodiments.

FIG. 2C is a top schematic view of heat transfer pedestal 220 having twelve portions 222a-226d, in accordance with certain embodiments. These twelve portions may be organized into four sector groups (e.g., a first group containing portions 222a, 224a, and 226a; a second group containing portions 222b, 224b, and 226b; a third group containing portions 222c, 224c, and 226c; and a fourth group containing portions 222d, 224d, and 226d). These groups may be viewed as sector portions of the pedestal presented in FIG. 2B. These twelve portions may also be organized into three circular groups (e.g., a first group containing portions 222a, 222b, 222c, and 222d; a second group containing portions 224a, 224b, 224c, and 224d; and a third group containing portions 226a, 226b, 226c, and 226d). These groups may be viewed as circular portions of the pedestal presented in FIG. 2B. All twelve portions may be independently movable with respect to each other in the vertical direction. Specifically, heat transfer pedestal 220 may be used for workpieces that deform asymmetrically similar to the pedestal presented in FIG. 2B. However, heat transfer pedestal 220 provides additional flexibility in controlling heat transfer. In certain embodiments, portions may also be moved in the various groups described above and/or various sub-groups.

Figure 2D:
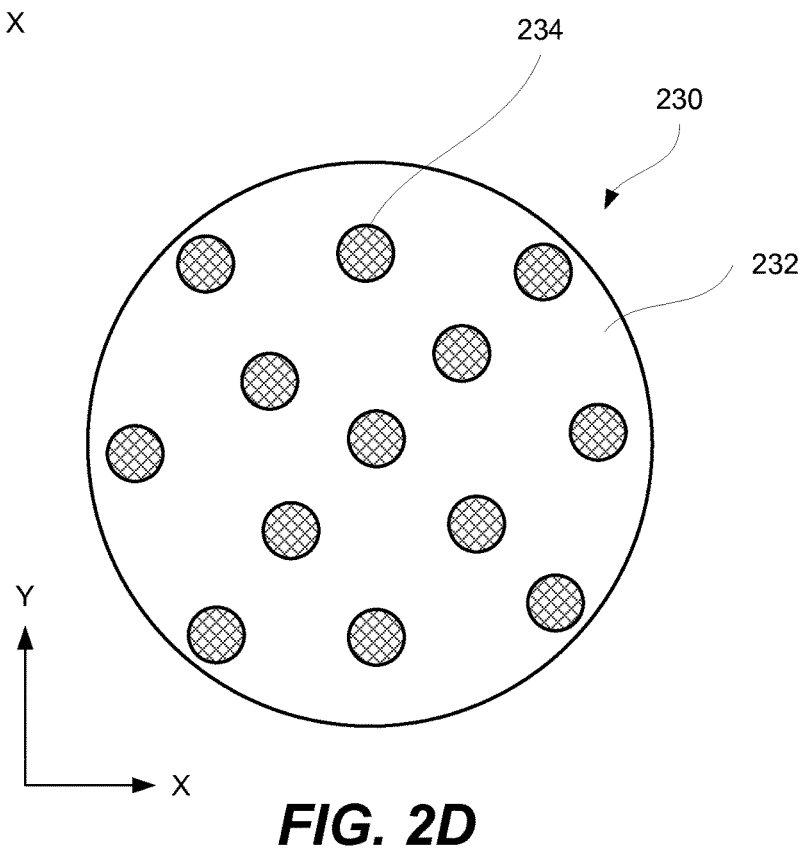
FIG. 2D is a schematic drawing depicting a top view of an adaptive heat transfer pedestal having multiple pegs that are movable in the vertical direction with respect to a base surface, in accordance with embodiments.

FIG. 2D is a top schematic view of heat transfer pedestal 230 having base surface 232 and multiple pegs 234 that are movable with respect to base surface 232 in the vertical direction, in accordance with certain embodiments. The vertical position of pegs 234 may be varied individually to adjust heat transfer distribution. A peg 234 may be brought closer to the workpiece to increase heat transfer in this location. In a similar manner, a peg 234 may be lowered and therefore moved away from the workpiece to reduce the heat transfer in this location. The position of pegs 234 may be controlled by sensors, which may be installed in the workpiece facing surfaces of pegs 234. Pegs 234 may have the same temperature as base surface 232. In other embodiments, pegs 234 have a different temperature than base surface 232. For example, when pedestal 230 is used for heating, pegs 234 may have a higher temperature than base surface 232. In specific embodiments, pegs 234 may be used to heat base surface 232 (i.e., base surface 232 may not have a separate heater).

Figure 3A:
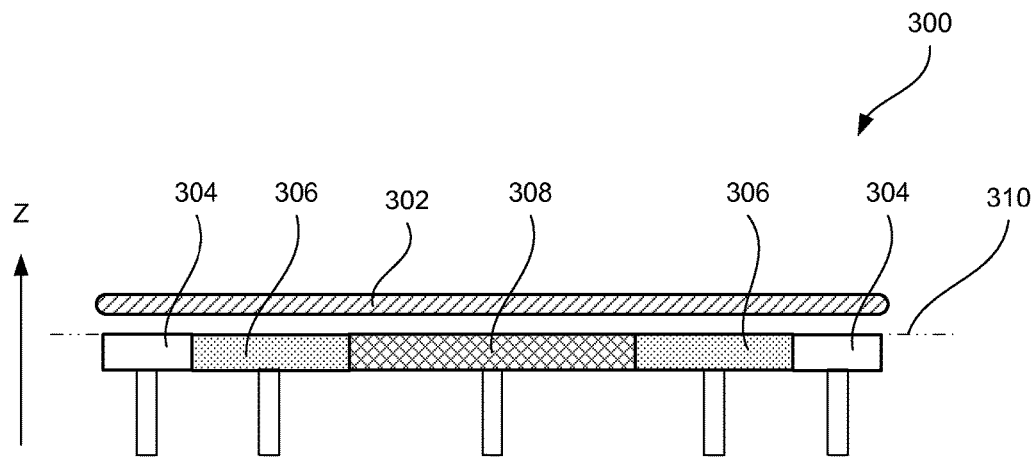
FIG. 3A is a schematic drawing depicting a cross-sectional view of a segmented adaptive heat transfer pedestal having three portions aligned with respect to a plane and a flat workpiece, in accordance with embodiments.

The vertical adjustment of multiple workpiece facing surfaces of a pedestal will now be explained with reference to FIGS. 3A-3C, which are schematic side views of segmented pedestal 300 having three portions 304, 306, and 308 having three different adjustments. Pedestal 300 may be similar to the pedestal illustrated in FIG. 2A and described above. FIG. 3A illustrates pedestal 300 supporting planar workpiece 302. Workpiece facing surfaces of all three portions 304, 306, and 308 are aligned with respect to plane 310 that is substantially parallel to planar workpiece 302. The gap between these workpiece facing surfaces and workpiece 302 is constant throughout the entire surface of workpiece 302.

Figure 3B:
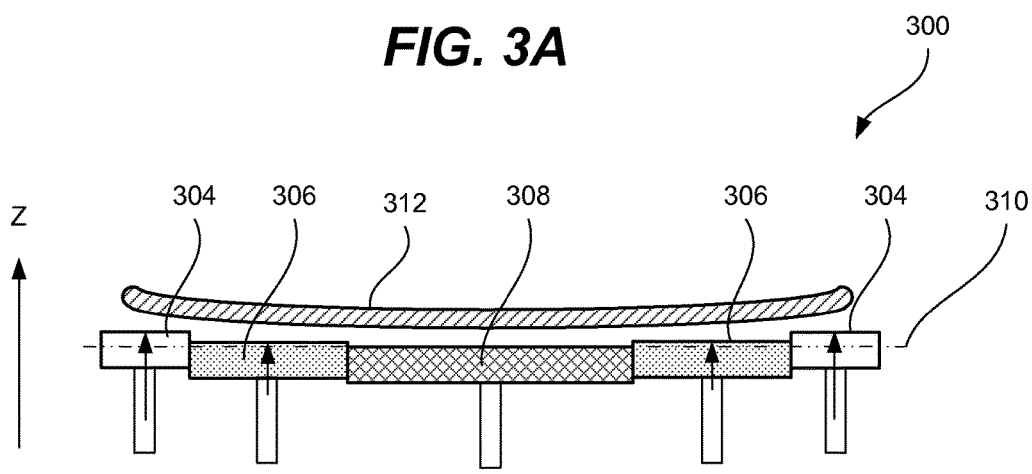
FIG. 3B is a schematic drawing depicting a cross-sectional view of the segmented adaptive heat transfer pedestal of FIG. 3A with the outer portions raised with respect to the plane and with a concave workpiece, in accordance with embodiments.

FIG. 3B illustrates pedestal 300 supporting concave workpiece 312. This workpiece has its center closer to plane 310 than its edges. As such, if workpiece facing surfaces of the three portions 304, 306, and 308 are aligned with respect to plane 310, the heat transfer may be be non-uniform. There may be more heat transferred between portion 308 and the center of concave workpiece 312 than, for example, between portion 304 and the edge of concave workpiece 312. If pedestal 300 is used for heating workpiece 312, this non-uniformity may result in the temperature of the center of workpiece 312 being higher than the temperature of the edge of workpiece 312. To avoid this non-uniformity, portions 304 and 306 are raised with respect to plane 310. Further, portion 304 may be raised more than portion 306 to better conform to the shape of concave workpiece 312.

Figure 3C:
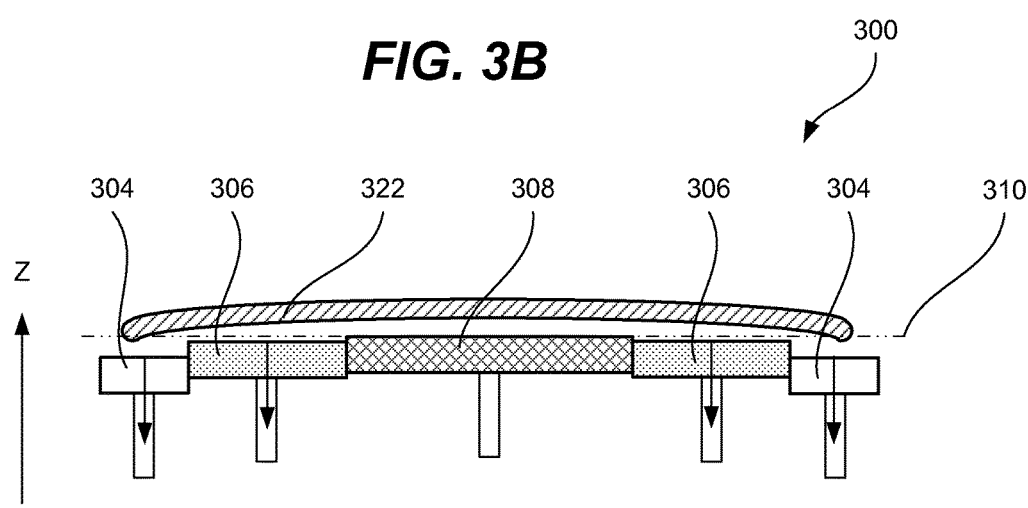
FIG. 3C is a schematic drawing depicting a cross-sectional view of the segmented adaptive heat transfer pedestal of FIG. 3A with the outer portions lowered with respect to the plane and with a convex workpiece.

FIG. 3C illustrates pedestal 300 supporting convex workpiece 322. This workpiece has its center further away from plane 310 than its edges. As such, if workpiece facing surfaces of three portions 304, 306, and 308 are aligned with respect to plane 310, the heat transfer may also be non-uniform. However, unlike in the example described above with reference to FIG. 3B, there may be less heat transferred between portion 308 and the center of convex workpiece 322 than, for example, between portion 304 and the edge of convex workpiece 322. If pedestal 300 is used for heating workpiece 322, this non-uniformity may result in the temperature of the center of workpiece 322 being lower than the temperature of the edge of workpiece 322. To try to avoid this non-uniformity, portions 304 and 306 are lowered with respect to plane 310. Further, portion 304 may be lowered more than portion 306 to better conform to the shape of convex workpiece 322.

Pivotable Workpiece Facing Surfaces

Figure 4A:
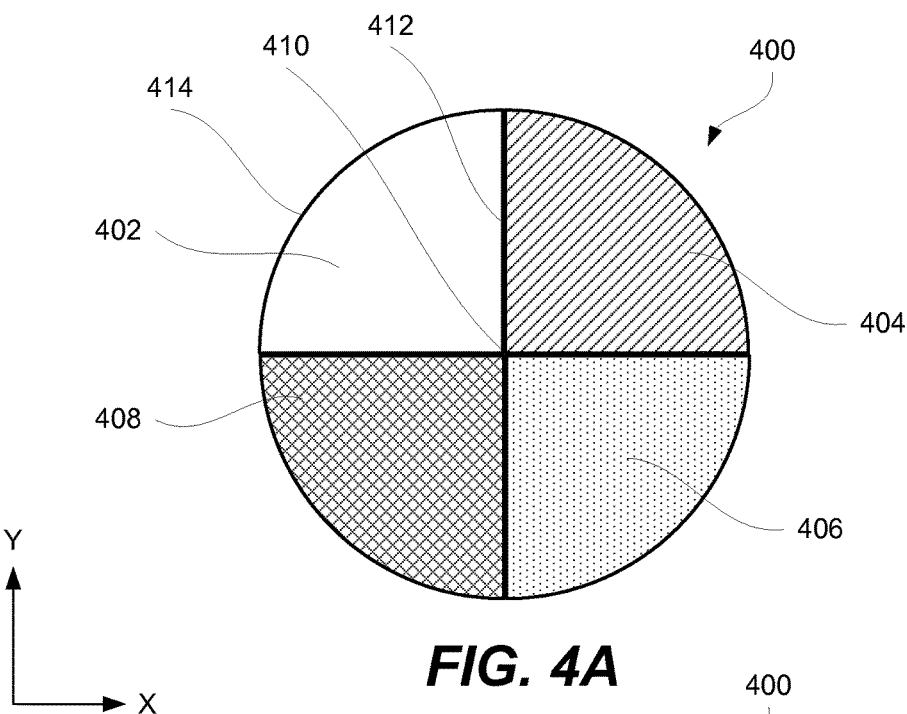
FIG. 4A is a schematic drawing depicting a top view of an adaptive heat transfer pedestal having four sector-shaped portions that can pivot about a pivot center, in accordance with embodiments.

Instead of or in addition to moving portions of the same pedestal in the vertical direction, these portions may be pivoted with respect to each other. In certain embodiments, a reference point used to define pivoting is the center of the pedestal. FIG. 4A is a top schematic view of pedestal 400 having four sector-shaped portions 402, 404, 406 and 408 in accordance with certain embodiments and may be similar to the pedestal illustrated in FIG. 2B. Portions 402-408 may be pivoted with respect to pivot center 410 of pedestal 400, with respect to edges 414 of pedestal 400, and/or with respect to interfaces 412 of adjacent portions. Hinges or other pivotable mechanisms may be provided at one or more of these locations. The overall diameter of pedestal 400 or separations between adjacent edges of portions 402-408 may change depending on pivoting locations. In general, a pedestal may have three or more sector-shaped pivotable portions.

Figure 4B:
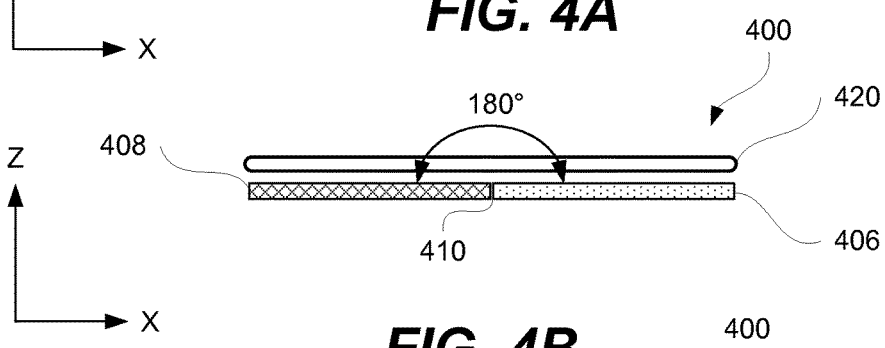
FIG. 4B is a schematic drawing depicting a cross-sectional view of the adaptive heat transfer pedestal of FIG. 4A and a flat workpiece.

The pivotable adjustment of multiple workpiece facing surfaces of the pedestal will now be explained with reference to FIGS. 4B-4D, which are schematic side views of segmented pedestal 400 showing portions 406 and 408 having three different adjustments. FIG. 4B illustrates pedestal 400 supporting planar workpiece 420. Workpiece facing surfaces of portions 406 and 408 are aligned with the same plane, and the angle between these surfaces is about 180° with respect to center 410 of pedestal 400. The gap between these workpiece facing surfaces and workpiece 420 is constant throughout the entire surface of workpiece 420.

Figure 4C:
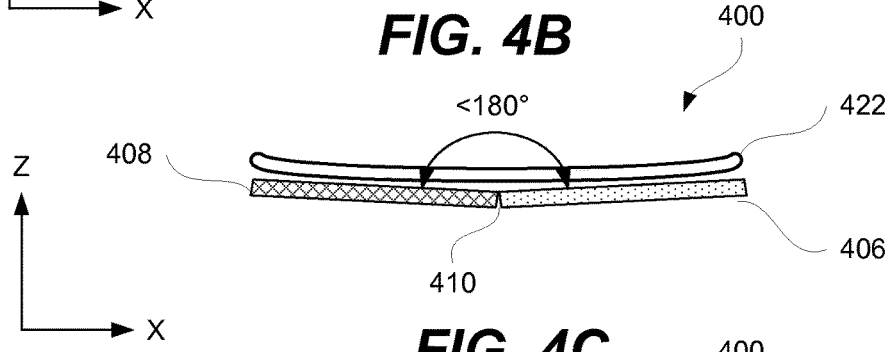
FIG. 4C is a schematic drawing depicting a cross-sectional view of the adaptive heat transfer pedestal of FIG. 4A with portions pivoted to adjust the workpiece facing surfaces to provide more conformal orientation to the concave workpiece.

FIG. 4C illustrates pedestal 400 supporting concave workpiece 422. Workpiece 422 has its center lower than its edges in the Z direction. As such, if workpiece facing surfaces of portions 406 and 408 are aligned with the same plane (as in FIG. 4B), the heat transfer may be non-uniform. There may be more heat transferred between the center portion of the workpiece and pedestal than between the edge portion. If pedestal 400 is used for heating workpiece 422, this non-uniformity may result in the temperature of the center of workpiece 422 being higher than the temperature of the edge of workpiece 422. To avoid this non-uniformity, portions 406 and 408 are pivoted with respect to center 410 of pedestal 400 such that the angle between these workpiece facing surfaces of these portions is less than 180° with respect to center 410. This adjustment provides more conformal orientation of the workpiece facing surfaces and more uniform heat transfer.

Figure 4D:
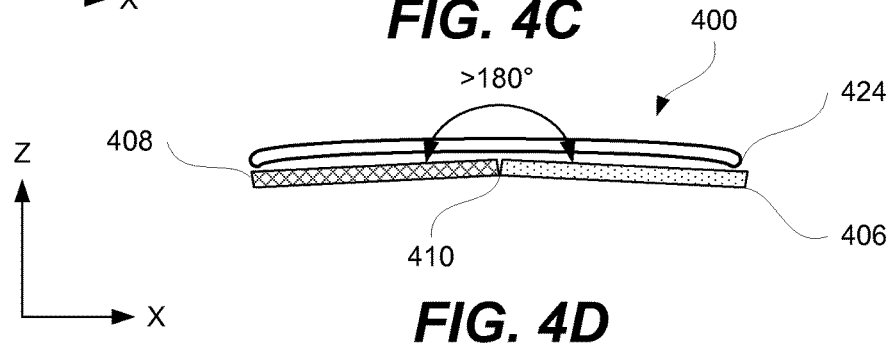
FIG. 4D is a schematic drawing depicting a cross-sectional view of the adaptive heat transfer pedestal of FIG. 4A with portions pivoted to adjust the workpiece facing surfaces to provide more conformal orientation to the convex workpiece.

FIG. 4D illustrates pedestal 400 supporting convex workpiece 424. Workpiece 424 has its center higher than its edges in the Z direction. As such, if workpiece facing surfaces of portions 406 and 408 are aligned with the same plane (as in FIG. 4B), the heat transfer may be non-uniform. There may be less heat transferred between the center portion of the workpiece and pedestal than between the edge portion. If pedestal 400 is used for heating workpiece 424, this non-uniformity may result in the temperature of the center of workpiece 424 being lower than the temperature of the edge of workpiece 424. To avoid this non-uniformity, portions 406 and 408 are pivoted with respect to center 410 of pedestal 400 such that the angle between these workpiece facing surfaces of these portions is greater than 180° with respect to center 410. This adjustment provides more conformal orientation of the workpiece facing surfaces and more uniform heat transfer.

Two Workpiece Facing Surfaces on Opposite Sides of a Workpiece

In certain embodiments, multiple heat transfer portions do not form the same pedestal or some other common body. Instead multiple heat transfer portions may be positioned apart from each other. In specific embodiments, two heat transfer portions may be positioned on opposite sides of a workpiece. A gap between these portions is adjustable to provide uniform heat transfer as further explained below. A workpiece may have a set position with respect to one portion and a variable position with respect to another portion. For example, one portion may have a set of MCA supports for supporting a workpiece. In certain specific embodiments, both portions are adjustable with respect to a workpiece.

Figure 5:
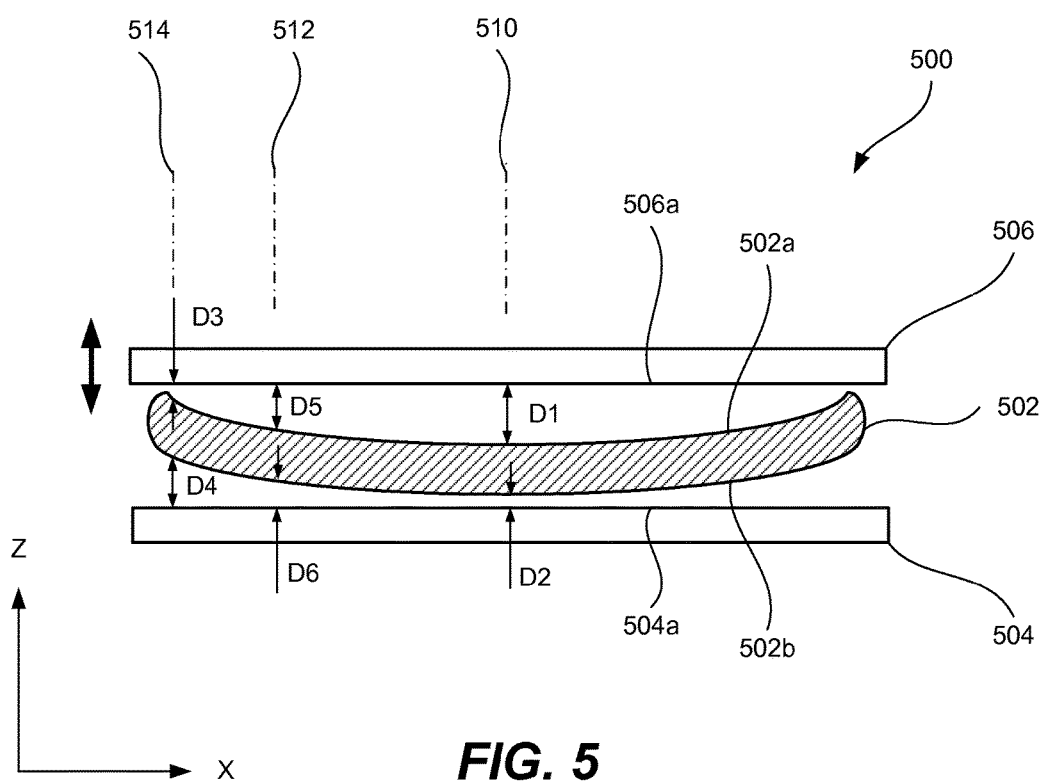
FIG. 5 is a schematic drawing depicting a cross-sectional view of an adaptive heat transfer system having two heat transfer portions and positioned on opposing sides of a workpiece, in accordance with embodiments.

FIG. 5 illustrates adaptive heat transfer system 500 having two heat transfer portions 504 and 506 positioned on different sides of workpiece 502. Workpiece 502 with a concave shape is used to illustrate differences in heat transfer fluxes at different locations throughout the workpiece 502, such as center location 510, midpoint location 512, and edge location 514. Workpiece 502 has top surface 502a facing surface 506a of heat transfer portion 506 and bottom surface 502b facing surface 504a of heat transfer portion 504.

Bottom heat transfer portion 504 may be a pedestal/platen, while top heat transfer portion 506 may be another platen, shower head, or some other component having heat transfer surface 506a. When adaptive heat transfer system 500 is a part of a load lock, two platens may be used for two heat transfer portions 504 and 506. When adaptive heat transfer system 500 is a part of a processing chamber, a platen may be used for bottom heat transfer portion 504, while a shower head may be used for top heat transfer portion 506. During heat transfer between a workpiece and the shower head used as top heat transfer portion 506, the shower head may or may not supply gas(es) into the processing chamber.

At center location 510, a gap between top surface 502a of workpiece 502 and surface 506a of heat transfer portion 506 (shown as D1) is greater than a gap between bottom surface 502b of workpiece 502 and surface 504a of heat transfer portion 504 (shown as D2). As such, a heat flux through the D2 gap may be greater than through the D1 gap. The temperature of workpiece 502 at center location 510 may depend on the combined heat flux through both D2 and D1 gaps. Any deficiencies in the heat flux through the D1 gap may be compensated by excesses in the heat flux through the D2 gap and vice versa.

At midpoint location 512, a gap between top surface 502a of workpiece 502 and surface 506a of heat transfer portion 506 (shown as D5) may be substantially the same as a gap between bottom surface 502b of workpiece 502 and surface 504a of heat transfer portion 504 (shown as D6). As such, a heat flux through the D5 gap may be substantially the same as through the D5 gap. Since heat transfer portions 504 and 506 are parallel (i.e., have a constant gap between their workpiece facing surfaces 504a and 506a) and since the thickness of workpiece 502 is substantially the same, the total height of the D5 and D6 gaps may be sufficiently the same as a the total height of the D1 and D2 gaps. As such, the heat flux at center location 510 may be substantially the same as at midpoint location 512.

At edge location 514, a gap between top surface 502a of workpiece 502 and surface 506a of heat transfer portion 506 (shown as D3) is less than a gap between bottom surface 502b of workpiece 502 and surface 504a of heat transfer portion 504 (shown as D4). As such, a heat flux through the D3 gap may be greater than through the D4 gap. The temperature of workpiece 502 at center location 510 may depend on the combined heat flux through both D3 and D4. Any deficiencies in the heat flux through the D4 gap may be compensated by excesses in the heat flux through the D3 gap and vice versa. Further, the combination of the D3 and D4 gaps may be substantially the same as the combination of the D1 and D2 gaps, which may be substantially the same as the combination of D5 and D6 gaps. As such, combined heat fluxes and/or temperatures at edge location 514 may be substantially the same as at midpoint location 512 and at center location 510.

Bendable Heat Transfer Plate Having Continuous Workpiece Facing Surface

Instead of using multiple heat transfer portions with fixed surfaces to conform to various deformations of workpieces, a heat transfer pedestal may have a bendable heat transfer plate with a continuous surface that is configured to change its shape to conform to shapes of workpieces. For example, a thin round plate may be supported along its edges with respect to the base support of the pedestal. A vertical force may be applied to a center of the plate to change its shape from planar to domed or bowed. The entire pedestal structure may have sufficient flexibility to allow for the center of the plate to move in the vertical direction with respect to the edges. The pressure may be applied by changing a pressure under the plate or pushing/pulling on the back side of the plate using some mechanical structure.

Figure 6A:
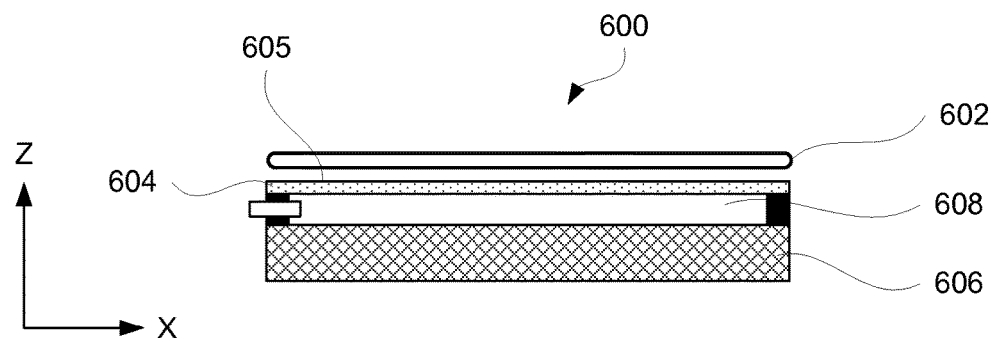
FIG. 6A is a schematic drawing depicting a side view of a pedestal having a base support and a bendable heat transfer plate supporting a planar workpiece, in accordance with certain embodiments.

FIG. 6A is a side schematic view of pedestal 600 having base support 606 and bendable heat transfer plate 604 supporting planar workpiece 602, in accordance with certain embodiments. Bendable heat transfer plate 604 has continuous workpiece facing surface 605 configured to change its shape to conform to a shape of workpiece 602. In this example, planar workpiece 602 is provided above surface 605. As such, plate 604 is not bent and surface 605 is kept planar as well to provide uniform heat transfer between workpiece 602 and surface 605.

Figure 6B:
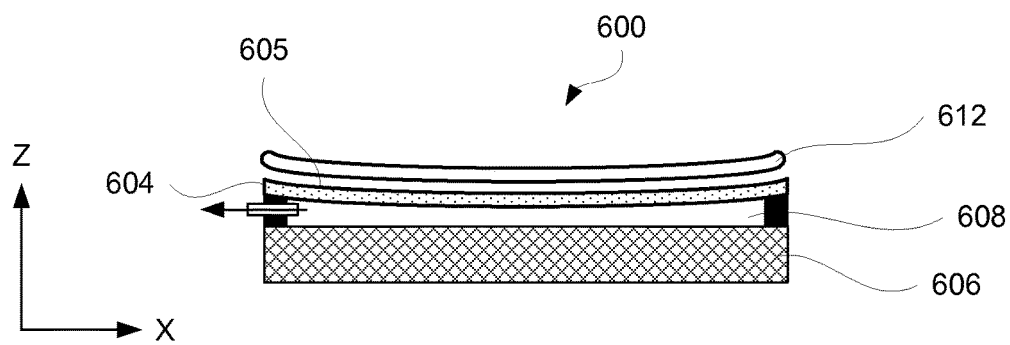
FIG. 6B is a schematic drawing depicting a side view of the pedestal of FIG. 6A with the bendable heat transfer plate bent downward in the center and a workpiece with a bowed shape, in accordance with embodiments.

FIG. 6B is a side schematic view of the same pedestal 600 having base support 606 and bendable heat transfer plate 604 supporting bowed workpiece 612, in accordance with certain embodiments. To ensure uniform heat transfer, plate 604 is bent (relative to its state shown in FIG. 6A) such that its workpiece facing surface 605 also has a bowed shape.

Plate 604 may be bent in such a way by applying a vertical downward force on the plate at least in or around the middle portion of plate 604. This force may be applied by reducing pressure below plate 604, such as within cavity 608 formed by plate 604. The pressure may be reduced by pumping liquid or gas out of cavity 608.

Figure 6C:
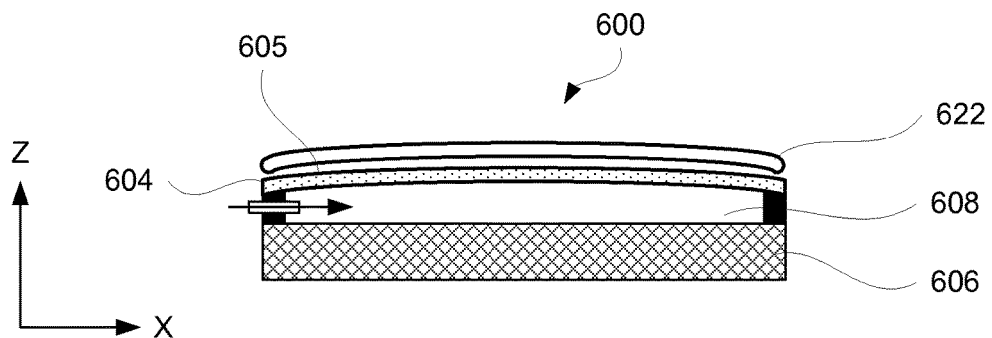
FIG. 6C is a schematic drawing depicting a side view of the pedestal of FIG. 6A with the bendable heat transfer plate bent upward in the center and a workpiece with a domed shape, in accordance with embodiments.

FIG. 6C is a side schematic view of the same pedestal 600 having base support 606 and bendable heat transfer plate 604 supporting domed workpiece 622, in accordance with certain embodiments. In this example, plate 604 is bent such that its workpiece facing surface 605 has a domed shape to conform to the shape of workpiece 622. Plate 604 may be bent in such a way by applying a vertical upward force on the plate at least in or around the middle portion of plate 604 by, for example, increasing pressure below plate 604. The pressure may be increased by pumping liquid or gas into cavity 608.

Figure 6D:
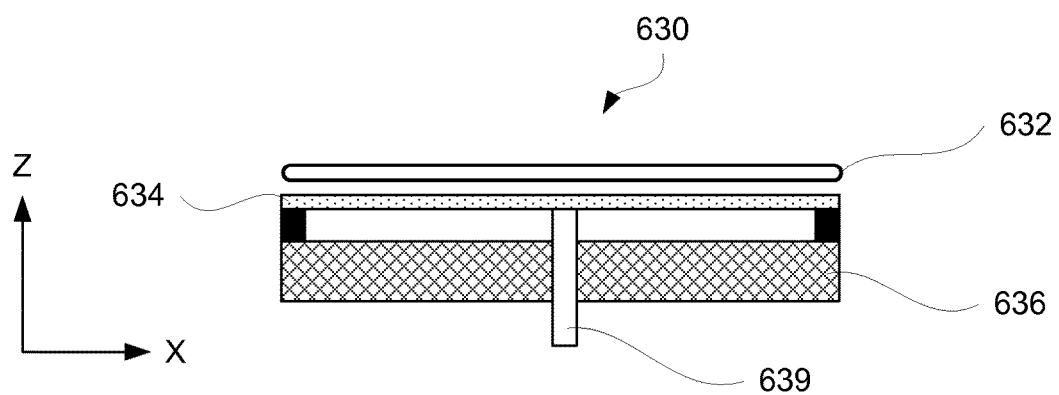
FIG. 6D is a schematic drawing depicting a side view of a pedestal having a base support, a bendable heat transfer plate supporting a planar workpiece, and a mechanical structure for bending the bendable heat transfer plate, in accordance with certain embodiments.

In another embodiment shown in FIG. 6D, a force is exerted by mechanical structure 639 attached to plate 634. Specifically, pedestal 630 includes base support 636 and bendable heat transfer plate 634 supporting workpiece 632, in accordance with certain embodiments. Plate 634 is bent by a force exerted by mechanical structure 639, which is configured to move with respect to base support 636. When mechanical structure 639 moves upward in the vertical direction (i.e., in the Z direction), plate 634 is bent into a domed shaped. When mechanical structure 639 moves downward in the vertical direction (i.e., in the Z direction), plate 634 is bent into a bowed shaped.

Sensors and System Controller

Adaptive heat transfer systems may include closed-loop controls for adjusting positions of multiple heat transfer portions and/or for changing the shape of continuous workpiece facing surface as described above. Closed-loop controls may include one or more sensors provided within one or more heat transfer portions or, more specifically, within one or more workpiece facing surfaces. Closed-loop controls may also include a system controller that receive inputs from these sensors and controls various mechanisms for adjustments and/or changes described above. Various examples of these closed-loop control components will now be described in more detail.

Figure 7A:
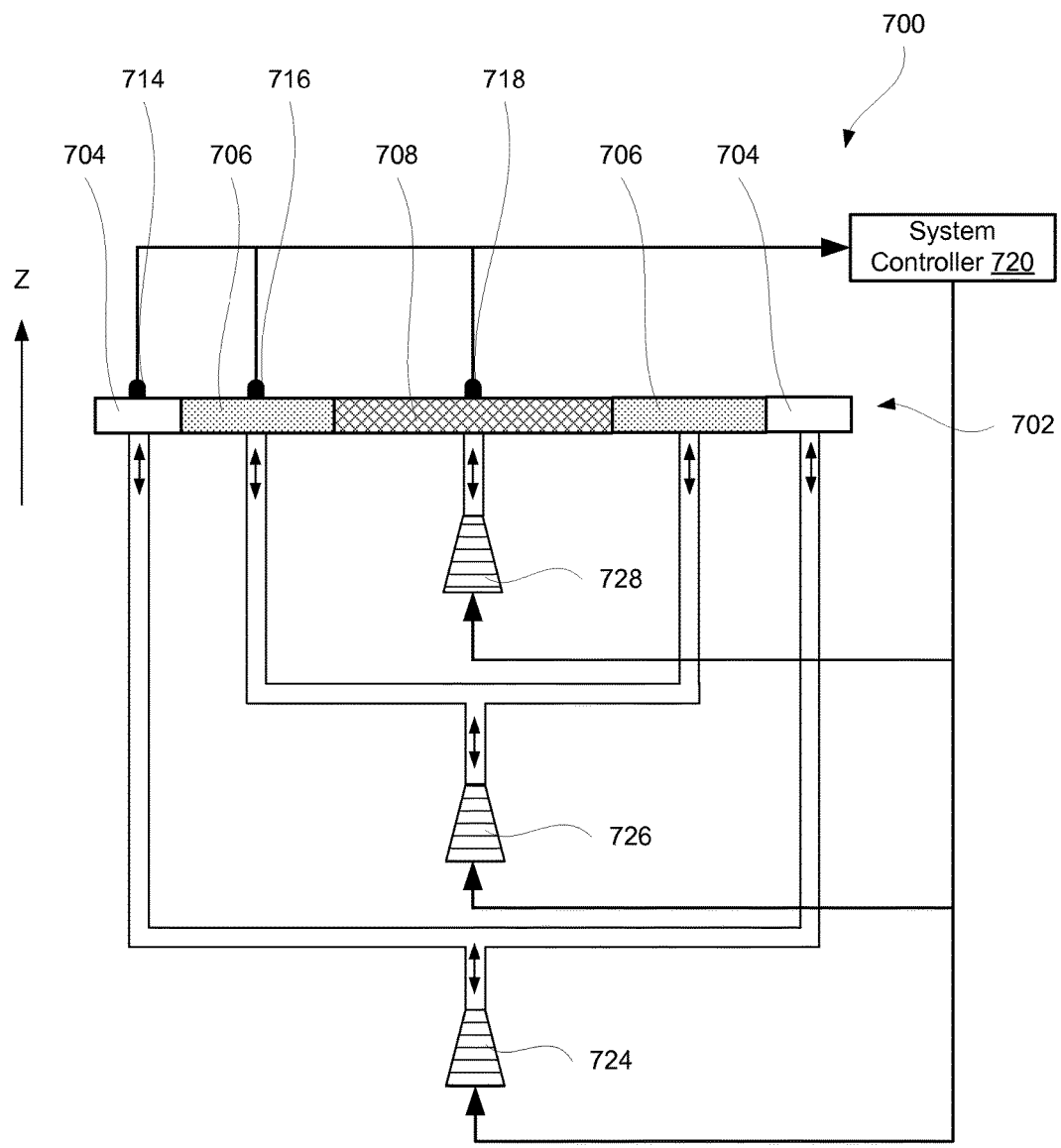
FIG. 7A is a schematic drawing depicting a side view of an adaptive heat transfer system including a segmented pedestal and a system controller, in accordance with certain embodiments.

FIG. 7A is a schematic representation of adaptive heat transfer system 700 including segmented pedestal 702 and system controller 720, in accordance with certain embodiments. Segmented pedestal 702 includes three portions 704, 706, and 708 and may be similar to the pedestal shown in FIG. 2A as described above. Portions 704, 706, and 708 are independently movable in the vertical direction (in the Z direction) by drivers 724, 726, and 728. In certain embodiments, one portion has a fixed position while the other two portions are movable. Portions 704, 706, and 708 have sensors 714, 716, and 718 installed in workpiece facing surfaces of portions 704, 706, and 708. Sensors 714, 716, and 718 may be used to detect gaps between the workpiece and workpiece facing surfaces and/or the temperature profile of the workpiece. Additional information about types of sensors and position of sensors on the workpiece facing surfaces are described below with reference to FIG. 7B.

The output of sensors 714, 716, and 718 is provided into system controller 720, which determines if the vertical positions of portions 704, 706, and 708 need to be adjusted. For example, if system 700 is used for heating a workpiece and sensors 714 and 718 identify that the edge of the workpiece has a lower temperature than the center of the workpiece, system controller 720 may instruct corresponding drivers to raise portion 704 and/or lower portion 708.

Drivers 724, 726, and 728 are sometimes referred to as actuators. In certain embodiments, drivers 724, 726, and 728 are servo-driven motors, which may include position feedback. Position of portions 704, 706, and 708 may be based on feedback from various servo mechanisms or obtained through encoders and/or potentiometers mounted to the shafts of drivers 724, 726, and 728. The rotary motion of drivers 724, 726, and 728 could be converted to axial motion for actuation of the pedestal segments using various mechanisms, such as lead-screw and/or ball-nut arrangements.

System controller 720 may receive input from all sensors as well as from a user interface (e.g., setting temperatures). System controller 720 typically includes one or more memory devices and one or more processors. The processor may include a central processing unit (CPU) or computer, analog and/or digital input/output connections, stepper motor controller boards, and the like. In certain embodiments, system controller 720 has a user interface associated with it. The user interface may include a display screen, graphical software displays of the apparatus and/or process conditions, and user input devices such as pointing devices, keyboards, touch screens, microphones, and the like.

System controller 720 or other system controllers (e.g. system controllers 921 or 1011) may control one or more of the activities of adaptive heat transfer system 700. For example, a system controller (e.g., system controller 720) may execute system control software including sets of instructions for controlling the timing of various processing operations, vertical positions of different pedestal portions (e.g., portions 704, 706, and 708), workpiece and pedestal portion temperatures, gaps, and other process parameters. Other computer programs may be stored on memory devices associated with system controller 720. These programs may be used for various processing and maintenance tasks. The computer program code for controlling the processing operations can be written in any conventional computer readable programming language: for example, assembly language, C, C++, Pascal, Fortran, or others. Compiled object code or script is executed by the processor to perform the tasks identified in the program. The controller parameters relate to process conditions such as, for example, timing of the processing operations, temperature of the workpiece (as controlled by, for example, the position of pedestal portions with respect to the workpiece and/or the energy/power delivered to the pedestal), and other parameters of a particular process. These parameters are provided to the user in the form of a recipe and may be entered utilizing the user interface.

The system software may be designed or configured in many different ways. For example, various chamber component subroutines or control objects may be written to control operation of the adaptive heat transfer system necessary to carry some operations described herein.

Adjustments within an adaptive heat transfer system may be performed once for every new workpiece, generally, soon after the workpiece is provided into the system. In other embodiments, adjustments are performed multiple times, such as after predetermined intervals or continuously while the workpiece is within the system. For example, a workpiece may change it shape due to the lessening of stresses within the workpiece because of heating or cooling. Further, a workpiece may change its shape due to coefficient of thermal expansion differences and/or increasing or reducing temperature gradients during heat transfer. In these situations, an initial adjustment of the pedestal may be insufficient to maintain uniform heat transfer after these changes in shape. An adaptive heat transfer system may dynamically adjust the vertical positions of different heat transfer portions and/or shapes of the continuous workpiece facing surface of the bendable heat transfer plate. For example, if a workpiece is initially provided with a dome shape, the central pedestal portion would be initially raised. As the workpiece relaxes and takes on a flatter shape, the central pedestal segments can be gradually lowered.

Figure 7B:
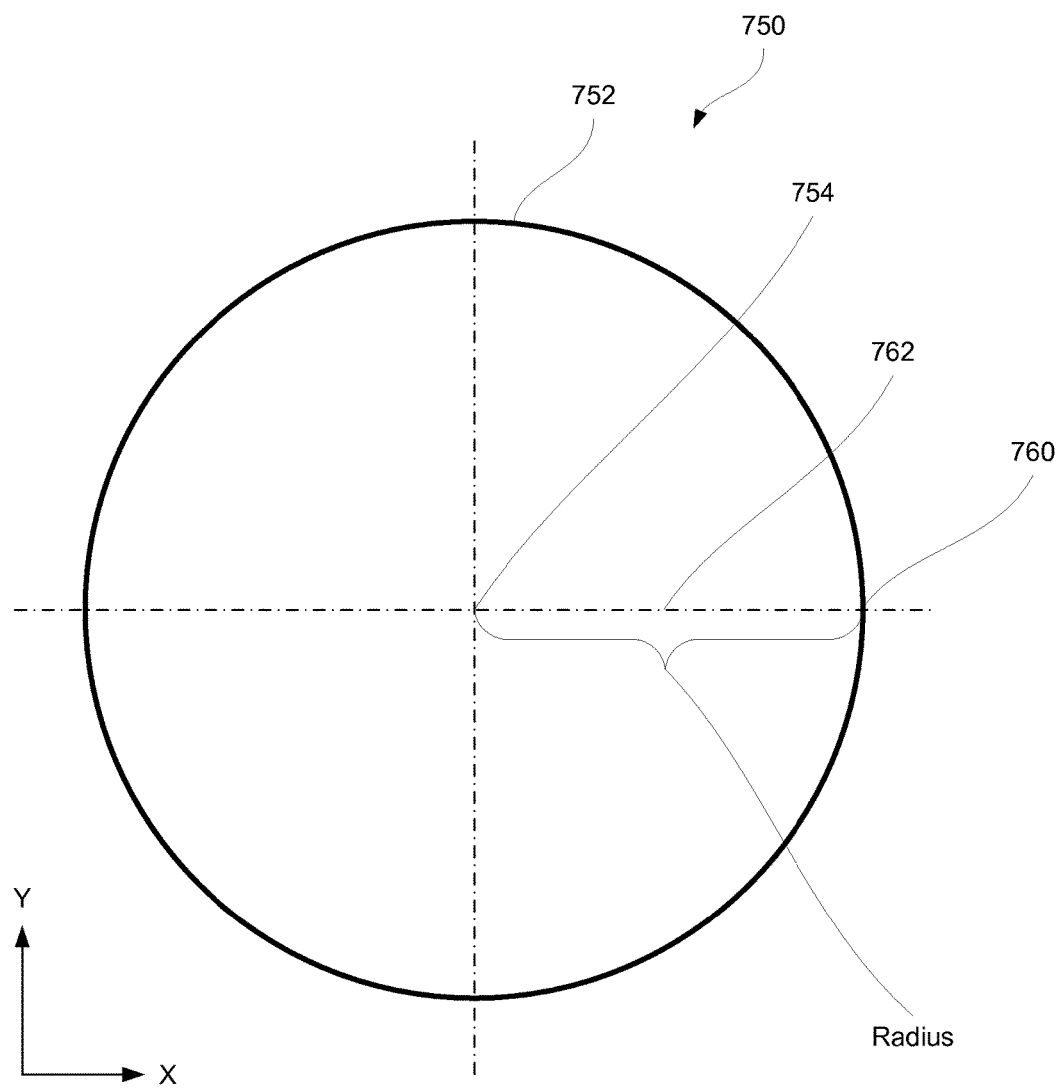
FIG. 7B is a schematic drawing of a top view of a workpiece facing structure with sensor(s), in accordance with certain embodiments.

FIG. 7B is schematic representation of workpiece facing surface 750 illustrating various locations of sensors throughout surface 750, in accordance with certain embodiments. Surface 750 may be formed by a single heat transfer portion, such as a bendable heat transfer plate or one of two plates positioned on opposite sides of the workpiece. In other embodiments, surface 750 may be formed by multiple heat transfer portions, such as concentric cylinders, sectors, or base surface/peg configurations described above. Although control components are described herein with reference to certain embodiments, similar control components can be used with reference to pedestals of other embodiments.

Surface 750 may have a round shape (as shown in FIG. 7B) or any other shape, such as a polygon shape. For simplicity, the following description refers to the round surface. Surface 750 may be defined by its center 754 and edge 752. For round surfaces, the distance between its center 754 and edge 752 is referred to as radius.

When workpieces have substantially symmetrical domed or bowed shapes, surface 750 may have two sensors positioned along one of its radius. For example, one sensor may be positioned at center 754, while another may be positioned at edge 752. If such sensors are used to measure the gap, they may reflect how deformed the workpiece is. In certain embodiments, an adaptive heat transfer system may include three or more sensors provided long the same radius. For example, one sensor may be positioned at center 754, another may be positioned at edge 752, while yet another one may be positioned in the middle between the other two sensors. This embodiment is illustrated in FIG. 7B with points 754, 762, and 760.

To profile other parts of workpieces, particularly when asymmetrically shaped workpieces are used, sensors may be distributed along multiple radii that may be at a certain angle with respect to each other. For example, one or more sensors may be positioned along the radius extending in the X direction, and one or more sensors may be positioned along the radius extending in the Y direction.

Sensors may include temperature measuring instruments employing non-contact pyrometry and/or workpiece-heat transfer surface gap measuring instruments employing optical or capacitive methods.

Processing Operations

Figure 8:
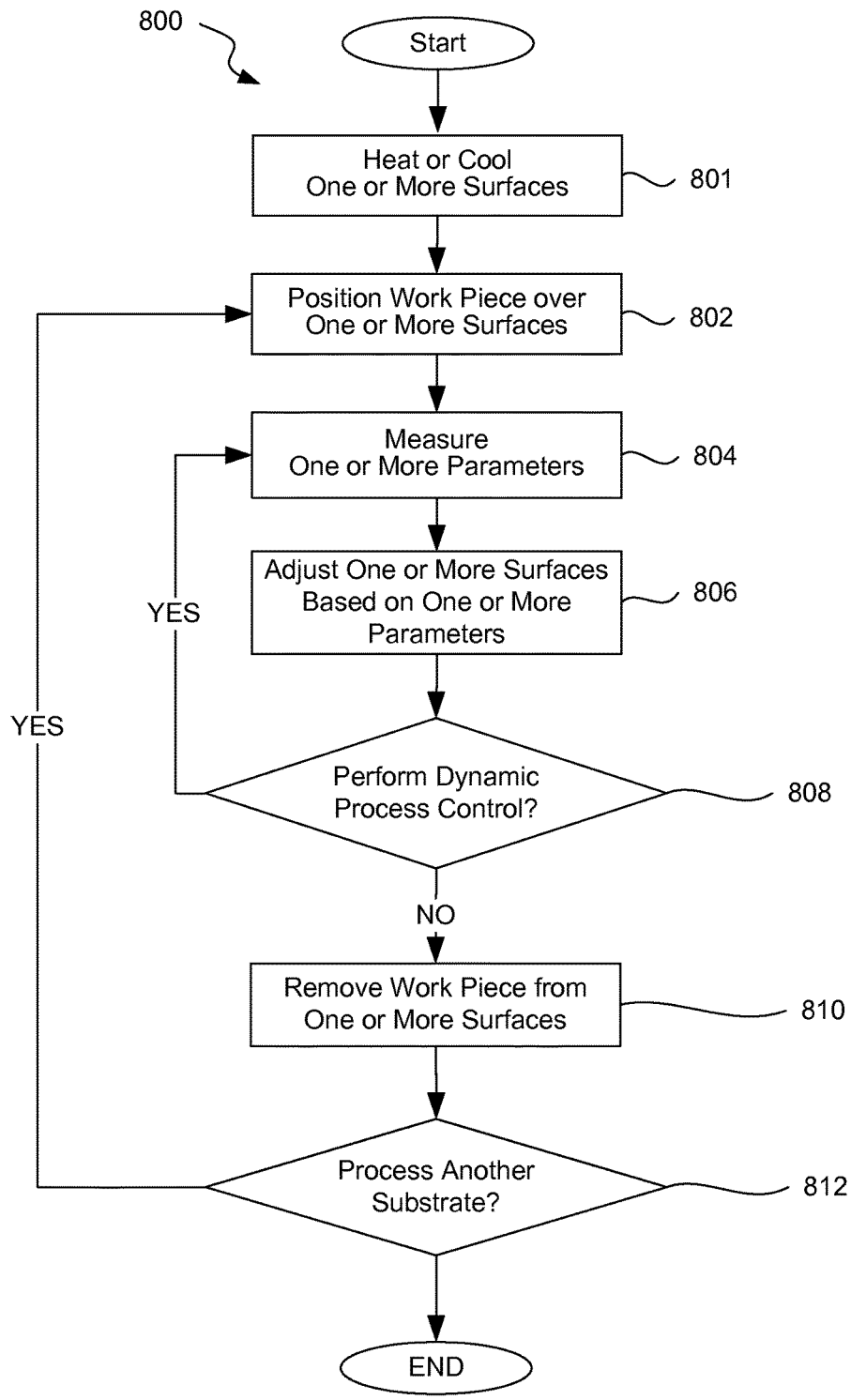
FIG. 8 is a flowchart illustrating a method for providing uniform heating/cooling of deformed workpieces, in accordance with certain embodiments.

Provided also are methods for providing uniform heating and/or cooling of deformed workpieces. FIG. 8 illustrates one example of such methods. In this example, method 800 commences with heating or cooling one or more surfaces used for heat transfer during operation 801. A workpiece is then positioned over the one or more surfaces in operation 802. In operation 802, one or more additional heat transfer surfaces may be provided above the workpiece.

Process 800 continues with monitoring one or more process parameters during operation 804. For example, a temperature profile and/or gap variations between the workpiece and one or more workpiece facing surfaces may be measured during this operation. These measurements are then used in operation 806 to adjust one or more heat transfer surfaces based on these measurements. For example, vertical positions of different heat transfer portions may be adjusted based on the temperature profile to ensure that the workpiece has a uniform temperature. These measurements and adjustments may be performed multiple times as illustrated by decision block 808. Repetitive measurements and adjustments may be referred to a dynamic process control.

Once the workpiece is heated or cooled to a predetermined temperature and, in certain embodiments, once various other operations (deposition, etching, etc.) are performed on the workpiece, it is removed from the one or more heat transfer surfaces during operation 810.

Various operations may be repeated for other workpieces as reflected by decision block 812. Multiple workpieces may have different degrees and types of deformations and may necessitate adjustments of one or more surfaces.

Multi-Station Apparatus Examples

Figure 9:
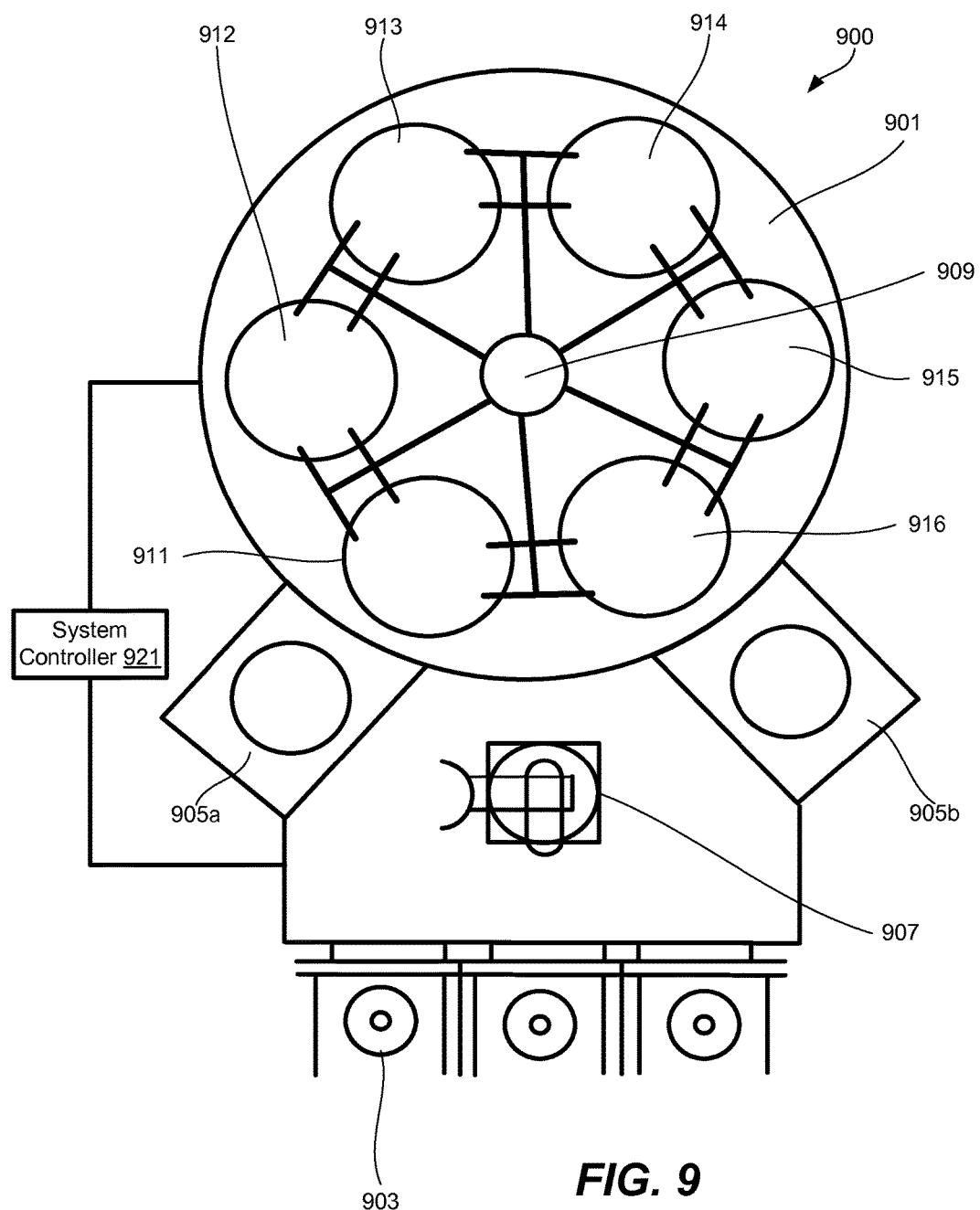
FIG. 9 is a schematic drawing of a top view of multi-station process apparatus that may be equipped with adaptive heat transfer systems, in accordance with certain embodiments.

Various heat transfer system examples described above may be used in a single station apparatus or a multi-station apparatus. FIG. 9 is a schematic illustration of a multi-station apparatus 900, in accordance with certain embodiments. Apparatus 900 includes a process chamber 901 and one or more cassettes 903 (e.g., Front Opening Unified Pods) for holding wafers to be processed and wafers that have completed the desired process (deposition, etch, etc.). Processing chamber 901 may have a number of stations, for example, two stations, three stations, four stations, five stations, six stations, seven stations, eight stations, ten stations, or any other number of stations. The number of stations in usually determined by the complexity of the processing operations and the number of these operations that can be performed in a shared environment. FIG. 9 illustrates a process chamber 901 that includes six stations 911-916. All stations 911-916 in the multi-station apparatus 900 within a single process chamber are exposed to the same pressure environment. However, each station 911-916 may have individual local plasma conditions as well as individual local heating conditions achieved by dedicated plasma generators, heaters, and platen configurations. One or more adaptive heat transfer systems described above may be provided to one or more of station 911-916 and/or load locks 905a and 905b.

A workpiece to be processed in apparatus 900 is loaded from one of the cassettes 903 through one or both load locks 905a and 905b into the station 911. An external robot 907 may be used to transfer the workpiece between the cassette 903 and load locks 905a and 905b. In the depicted embodiment, there are two separate load locks 905a and 905b. Load locks 905a and 905b are used to transfer workpieces between one pressure environment (e.g., an atmospheric pressure outside of process chamber 901) and another pressure environment (e.g., a much lower pressure inside process chamber 901). Once the pressure is equilibrated to a level corresponding to the internal environment of process chamber 901, another transferring device (not shown) may be used to move the workpiece from load lock 905a onto the station 911. The same or another transferring device may be used to move a workpiece from station 916 back into load lock 905b for removal from processing chamber 901. An internal robot 909 may be used to transfer workpieces among processing stations 911-916. Internal robot 909 may include a spindle assembly having multiple arms extending towards processing stations. Each arm may have four fingers (e.g., two fingers on each side of the arm extending towards the stations). These fingers are used to lift, lower, and position workpieces within the processing stations.

Before a workpiece is positioned onto station 911, the corresponding arms of the internal robot 909 are positioned such that four fingers (i.e., two fingers on each side of the two adjacent arms positioned on opposite sides of station 911) reside within the recesses of the platen. As explained above, these recesses are adapted for receiving such fingers. The fingers may then be lifted from the recesses of station 911 to support the workpiece above station 911 and to move the workpiece onto another station. Accordingly, the recesses of other stations are also configured for receiving these fingers. Overall, the recesses of any station are configured to receive any set of fingers of internal robot 909. Internal robot 909 and the pedestals of stations 911-916 are configured to move vertically with respect to each other in order to raise the workpiece above the pedestals' surfaces or to position the workpiece onto the pedestals' surfaces. It would be understood by one having ordinary skills in the art that positioning the workpiece onto a pedestal's surface may or may not involve a direct contact between substantial portions of these components. For example, a pedestal may be equipped with a MCA support to prevent excessive contact with the back side of the workpiece. For purposes of describing overall semiconductor processing apparatus embodiments and processing embodiments, the workpiece is said to be positioned on the pedestal even though it is supported by the MCA supports. Furthermore, internal robot 909 and the pedestals of stations 911-916 are configured to move rotationally with respect to each other in order to move workpieces from one station to another. Since all stations are present in the same environment, there is no need for load locks or other types of transfer ports in between the stations. One workpiece may be processed (including heating) on each station or a selected sub-set of stations.

One station (e.g., station 911) may be reserved for the initial heating of the newly received workpiece wafer. This station may be equipped with a heating lamp positioned above the station. The initial temperature of the workpiece may be around room temperature (e.g., about 25° C.). The temperature after this pre-heating operation may exceed 300° C. and is generally determined by the subsequent operation, such deposition or etching. Various heat transfer systems described above may be used for this station. For example, a system with heat transfer portions positioned on opposites sides of the workpiece may be used on this station since no processing is performed on this station.

Other stations (e.g., stations 912, 913, 914, 915, and 916) may be used for other types of processing. Processing on multiple stations in the apparatus may be performed sequentially or in parallel. In certain embodiments, all or some selected processing stations of apparatus 900 may have adaptive heat transfer systems. As noted above, some or all of the processing stations may be provided with their own RF power supply, such as a downstream inductively coupled plasma RF source. These stations may also be equipped to apply a bias to a workpiece positioned on the pedestal surface. Furthermore, some or all of the platens may be equipped with a heating element. Various heat transfer systems described above may be used for these stations as well.

Different stations may have pedestals at different vertical positions with respect to internal robot 909. For example, stations 912 and 913 may have their pedestals residing in lowered positions to have lower heat transfer fluxes from these pedestals. These stations may be used, for example, to etch an implanted crust from a photoresist. Thus, there may be a gap between the workpieces and pedestals during this operation to keep the workpieces at lower temperatures than during other operations performed on other stations. This gap may be between about 0.1 inches and 3 inches or, more specifically, between about 1.5 inches and 2.5 inches. The gap may be selected and/or adjusted during processing based on one or more factors, such as the emissivity of a wafer-facing surface of the platen, temperature of the platen, initial temperature of the wafer when it is transferred to the station, wafer temperature requirements during the operation, thermal budget of the wafer, resistivity of the wafer, type of the layers on the workpiece, and other process parameters. A lowered position of the pedestal is defined as any position where the pedestal (i.e., its workpiece-facing surface or MCA supports) is not in contact with the workpiece. These differences in the vertical orientations of the pedestals (i.e., between the raised and lowered positions) allows for achieving different workpiece temperatures while maintaining substantially similar pedestal heating configurations (both in terms of the pedestals' structures and heating elements' output). Alternatively, different stations may have different types of adaptive heat transfer systems or the same type of adaptive heat transfer systems that are configured differently. In the same or other embodiments, these pedestals may be made from less thermally conductive materials. Furthermore, the heaters' outputs may be controlled to achieve different workpiece temperatures.

One example of an etch process called high dose implant strip (HDIS) using multi-station apparatus 900 will now be briefly described. In this process, the workpiece is coated with a layer of photoresist that has been used to mask designated areas of the said workpiece during a process to implant dopants. Subsequent to the dopant implant, it is required that the remaining photoresist be etched or removed from the workpiece in preparation for subsequent processing steps. Due to the implant process, photoresist layers that have masked the designated areas of the workpiece develop a hardened crust on the outside, while retaining a softer bulk photoresist on the inside. A workpiece is first positioned on station 911, with its pedestal in a raised position, and heated to a temperature of between about 120° C. and 140° C. When the workpiece is moved to station 912 and then to station 913, the pedestals of these stations are in lowered positions so that the workpiece does not contact these pedestals and the heat transfer is minimized. Alternatively, one or both pedestals of stations 912 and 913 may be raised during a part of or the entire processing. In certain embodiments, these pedestals are configured to maintain the temperature of the workpiece at the same level (e.g., between about 120° C. and 140° C. reached on station 911) while the photoresist crust is etched. Then the workpiece is moved to station 914 to start bulk stripping. The workpiece temperature may need to be increased to at least about 250° C. or, more specifically, to about 280° C. The pedestal of this station may be in a raised position.

In certain embodiments, an apparatus is used to process different workpiece types. For example, the same apparatus may be used to strip "un-crusted" photoresist, which generally requires high-temperature conditions, and crusted photoresist, which needs lower temperature conditions. Switching between these different temperature operating regimes may use different configurations of adaptive heat transfer systems. This structural change of the apparatus may be coupled with changes in heater outputs and/or the vertical position of the pedestal.

In certain embodiments, a system controller 921 is used to control process conditions for various operations of the stripping process described below. For example, system controller 921 may control positions of the pedestals in each station 911-916 as well as their heater outputs and various parameters of adaptive heat transfer systems described above.

Multi-Chamber Apparatus Example

Figure 10:
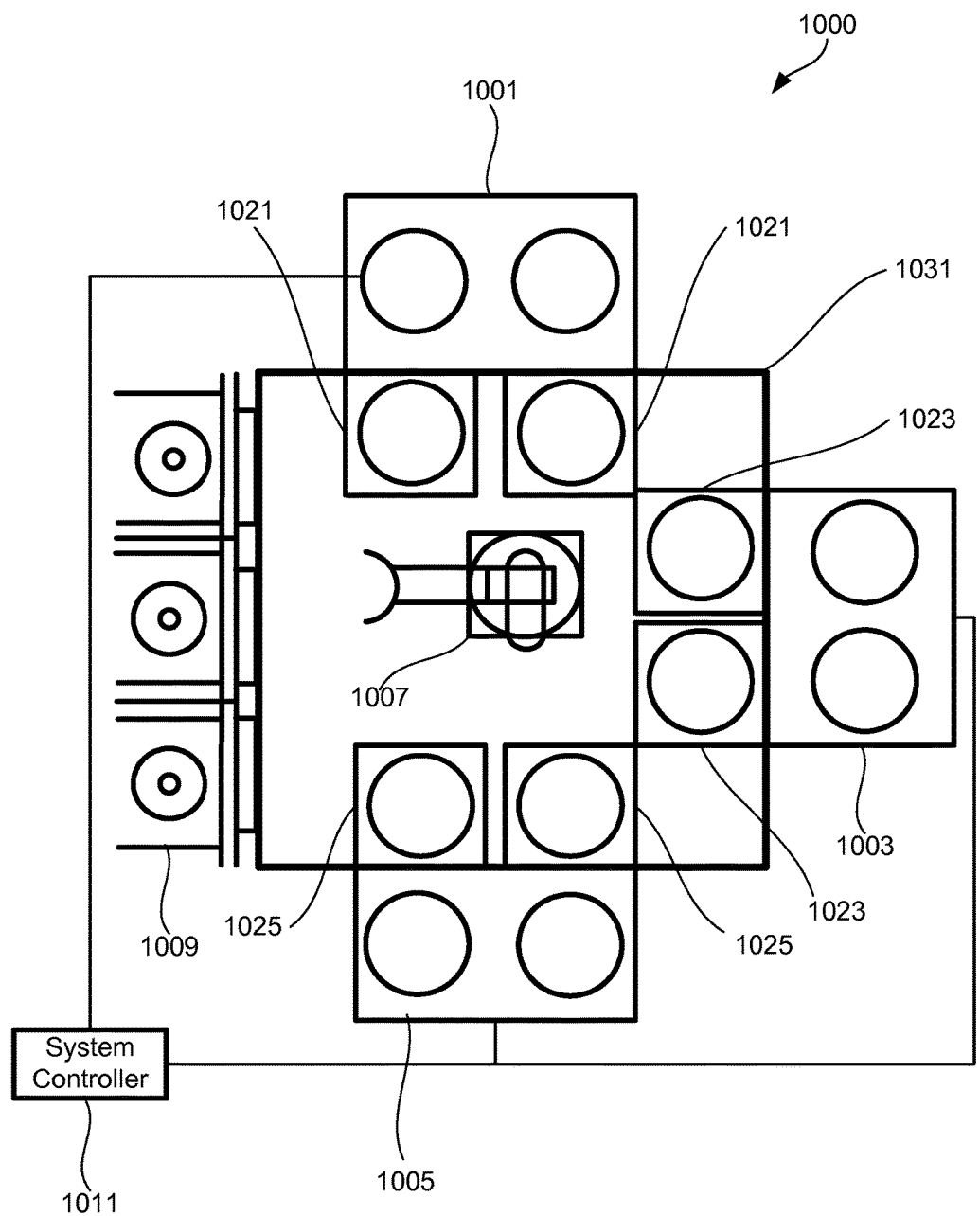
FIG. 10 is a schematic drawing of a top view of a multi-chamber apparatus that may be equipped with adaptive heat transfer systems, in accordance with certain embodiment.

FIG. 10 is a schematic illustration of a multi-chamber apparatus 1000 that may be equipped with adaptive heat transfer systems, in accordance with certain embodiment. Apparatus 1000 may have three separate chambers 1001, 1003, and 1005 (as shown) or any other number of chambers. Each chamber 1001-1005 has its own pressure environment, which is not shared with other chambers. For example, chamber 1001 may operate at a different pressure level than chambers 1003 and 1005 or have a different chemical composition in its environment. This provides additional processing flexibility, but also requires transferring workpieces through transfer ports between different operating environments in order to prevent cross-contamination between these environments. Specifically, FIG. 10 illustrates each chamber having two load locks (i.e., chamber 1001 having a set of load locks 1021, chamber 1003 having a set of load locks 1023, and chamber 1005 having a set of load locks 1025). It should be understood that any number of load locks may be used for each individual chamber. Load locks 1021-1025 may be exposed to an intermediate environment 1031, which may be different than the ambient environment of storage cassettes 1009, and be separated from storage cassettes 1009 by a set of load locks (not shown). Furthermore, one or more chambers 1001-1005 may share its environment with intermediate environment 1031 and, therefore, one or more corresponding load lock sets 1021-1025 may be omitted or kept open on both sides.

FIG. 10 shows each chamber equipped with two stations. However, any number of stations may be used. In one embodiment, one or more chambers of the multi-chamber apparatus may be similar to the six-station examples described above with reference to FIG. 9. Each chamber does not have to have the same number of stations. One or more stations of multi-chamber apparatus 1000 have adaptive heat transfer systems as described above. In certain embodiments, all of the stations in one of the chambers or in all chambers have adaptive heat transfer systems. Adaptive heat transfer systems may be positioned on any one of the processing chambers or load locks.

Multi-chamber apparatus 1000 may also have a shared workpiece handling robot 1007 for transferring wafers between load locks 1021-1025 and one or more cassettes 1009 or some other components. Each chamber, and even each individual station, may be controlled by a system controller 1011, which may be configured similar to the ones described above with reference to FIG. 9.

Experimental/Modeling

Modeling tests were performed to compare adaptive pedestals to conventional static pedestals. Silicon wafers having a diameter of 450 mm and a 1 millimeter initial domed deformation were used for modeling. The starting temperature was 350°. The temperature was initially uniform throughout the substrate.

One model involved a conventional flat substrate maintained at a temperature of 25° C. The substrate was positioned at a distance of about 254 micrometers from the substrate. Because of the domed deformation, the edge of the substrate was 1 millimeter closer to the pedestal surface than the center of the substrate. Another model involved an adaptive pedestal with three concentric cylindrical portions. The center portion had a diameter of 150 millimeters, the middle portion had an outer diameter of 300 millimeters, and finally the edge portion had an outer diameter of 450 millimeters. The inner diameter of the middle portion was substantially the same as the diameter of the center portion, while the inner diameter of the edge portion was substantially the same as the outer diameter of the middle portion. All three portions were kept at 25° C.

The three portions of the pedestal were adjusted to follow the profile of the substrate. That is, the center portion was raised by 1 millimeter with respect to the edge portion, and the middle portion was raised by 0.5 millimeters with respect to the edge portion.

These models were used to simulate cooing of the substrates for 10 minutes. The temperatures of substrate edges and centers were monitored during this time. Furthermore, deflection of both substrates was estimated during this period.

Figure 11A:
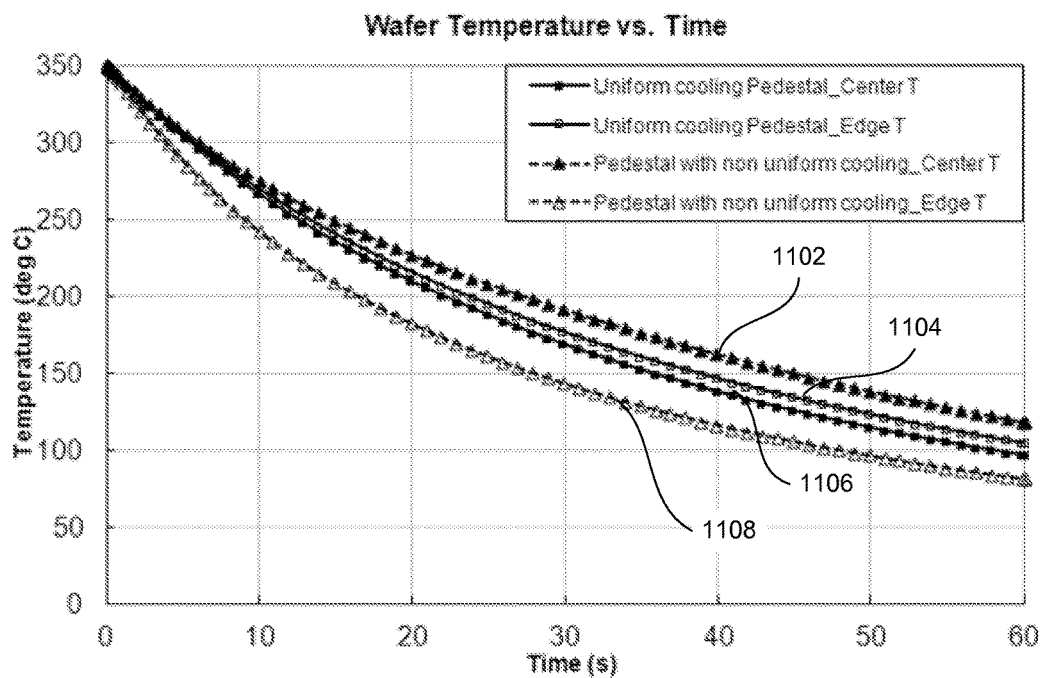
FIG. 11A is a graph illustrating temperature profiles of conventional flat pedestals as compared to adaptive pedestals of embodiments.

FIG. 11A illustrates four temperature profiles during the first 10 minutes of the modeling. Line 1102 is a temperature profile of the center portion of the substrate cooled using the conventional flat pedestal. Line 1104 is a temperature profile of the edge portion of the substrate cooled using the adaptive pedestal. Line 1106 is a temperature profile of the center portion of the substrate cooled using the adaptive pedestal. Line 1108 is a temperature profile of the center portion of the substrate cooled using the conventional pedestal. Clearly, lines 1104 and 1106 are much closer to each other than lines 1102 and 1108, which indicates that the substrate cooled using the adaptive pedestal had a much more uniform temperature profile that the substrate cooled using the conventional flat pedestal.

Figure 11B:
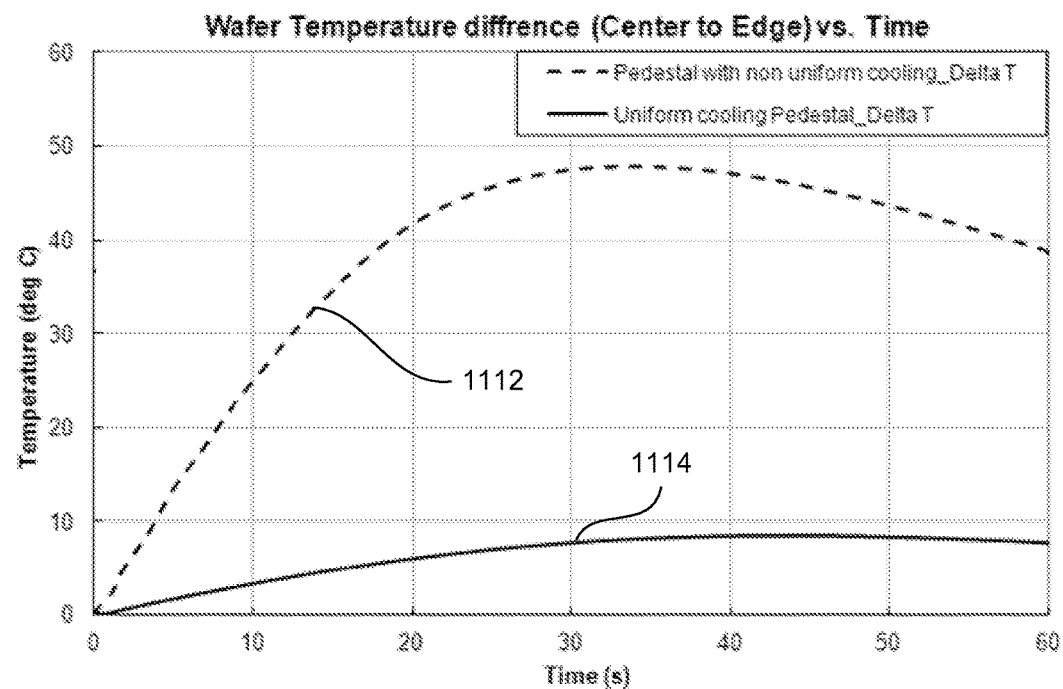
FIG. 11B is a graph illustrating temperature profiles between the center and edge portions of a conventional flat pedestal and an adaptive pedestal of embodiments.

The difference in performance is even more evident from FIG. 11B that illustrates two profiles of temperature differences between the center and edge portions for the two substrates. Line 1112 corresponds to the substrate cooled using the conventional flat substrate, while line 1114 corresponds to the substrate cooled using the adaptive pedestal described above. At some point during modeling, the center of the substrate cooled with the conventional flat substrate was 48° C. hotter than the edge. The temperature deviation for the substrate cooled with the adaptive pedestal was generally less than 10° C.

Figure 11C:
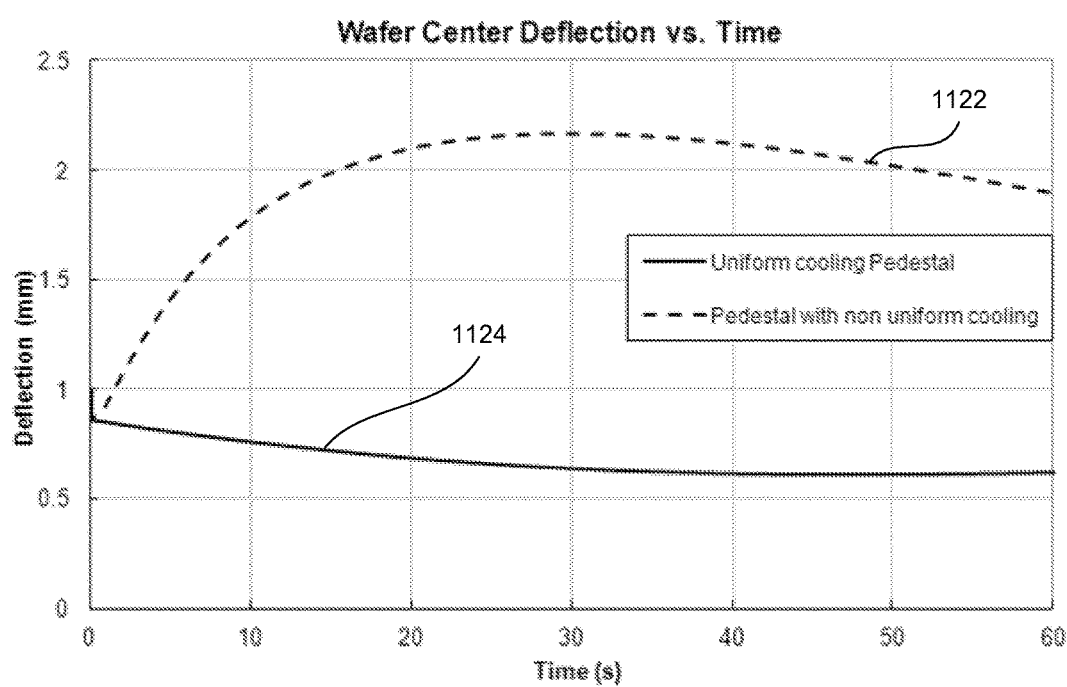
FIG. 11C is a graph illustrating deflection profiles of a conventional flat pedestal and an adaptive pedestal of embodiments.

FIG. 11C illustrates modeled deflection profiles for the two substrates. Line 1122 represents deflection of the substrate cooled using the conventional flat substrate, while line 1124 represents deflection of the substrate cooled using the adaptive pedestal described above. Initially, both substrates had a deflection of about 1 millimeter. Deflection of the substrate cooled using the adaptive pedestal was actually reduced to about 0.6 millimeters during cooling. At the same time, deflection of the substrate cooled using the conventional flat pedestal increased and peaked at about 2.2 millimeters during cooling.

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. An adaptive heat transfer system comprising:
an adaptive pedestal for receiving a workpiece in a semiconductor processing chamber, the adaptive pedestal comprising:
a first portion for receiving the workpiece, the first portion having a first workpiece-facing surface; and
a second portion having a second workpiece-facing surface, wherein the first and second portions are configured to be independently movable in a direction substantially perpendicular to a plane, wherein the first and second portions are sector-shaped and their respective first and second workpiece-facing surfaces are sectors, wherein each sector is bounded by two radii and an arc of a circle, wherein each of the two radii is a line segment extending from the center of the circle to the circumference of the circle, and wherein the first and second portions are located to one side of the workpiece when the workpiece is received by the adaptive pedestal; and a system controller configured to control movement of the first and second portions of the adaptive pedestal.

2. The adaptive heat transfer system of claim 1, further comprising a set of supports extending from at least one of the first and second workpiece-facing surfaces, the set of supports for supporting the workpiece.

3. The adaptive heat transfer system of claim 1, wherein the workpiece is supported at a predetermined distance above the first workpiece-facing surface.

4. The adaptive heat transfer system of claim 1, further comprising a third portion of the adaptive pedestal, wherein the third portion is annulus sector-shaped and is independently movable from the first and second portions, wherein the third portion has a third workpiece-facing surface that is an annulus sector.

5. The adaptive heat transfer system of claim 1, wherein the first and second portions are at of independently movable cylinders.

6. The adaptive heat transfer system of claim 1, wherein each of the first and second portions includes at least one peg.

7. The adaptive heat transfer system of claim 1, further comprising a third portion of the adaptive pedestal having a third workpiece-facing surface, wherein the third portion is sector-shaped and independently movable from the first and second portions in the direction substantially perpendicular to the plane, and wherein the third portion is located to the one side of the workpiece when the workpiece is received by the adaptive pedestal.

8. An adaptive heat transfer system comprising:

an adaptive pedestal for receiving a workpiece in a semiconductor processing chamber, the adaptive pedestal comprising one or more concentric ring-shaped portions for receiving the workpiece, wherein at least one of the concentric ring-shaped portions has a plurality of independently movable annulus sector-shaped regions, each of the annulus sector-shaped regions having a workpiece-facing surface that is an annulus sector bounded by two radii and two arcs of two concentric circles respectively, wherein each of the two radii is a line segment extending from the center of the two circles to the circumference of the outermost of the two concentric circles, and wherein the concentric ring-shaped portions are located to one side of the workpiece when the workpiece is received by the adaptive pedestal; and a system controller configured to control movement of the annulus sector-shaped regions.

9. The adaptive heat transfer system of claim 8, further comprising a set of supports extending from the a plurality of independently movable annulus sector-shaped regions of the adaptive pedestal, the set of supports for supporting the workpiece.

10. The adaptive heat transfer system of claim 9, wherein the workpiece is supported at a predetermined distance above the workpiece-facing surface of the annulus sector-shaped regions.

11. The adaptive heat transfer system of claim 8, wherein the annulus sector-shaped regions are at ends of independently movable cylinders.

* * * * *